(12) United States Patent
Jeong et al.

(10) Patent No.: US 11,616,086 B2
(45) Date of Patent: Mar. 28, 2023

(54) THIN FILM TRANSISTOR PANEL, ELECTRIC DEVICE INCLUDING THE SAME, AND MANUFACTURING METHOD THEREOF

(71) Applicant: ADRC. CO. KR, Seoul (KR)

(72) Inventors: Duk Young Jeong, Seoul (KR); Chae Yeon Hwang, Seoul (KR); Dong Gyu Eo, Seoul (KR)

(73) Assignee: ADRC. CO. KR, Seoul (KR)

( * ) Notice: Subject to any disclaimer, the term of this patent is extended or adjusted under 35 U.S.C. 154(b) by 98 days.

(21) Appl. No.: 17/124,819

(22) Filed: Dec. 17, 2020

(65) Prior Publication Data
US 2021/0210525 A1    Jul. 8, 2021

(30) Foreign Application Priority Data
Jan. 6, 2020 (KR) .................. 10-2020-0001553

(51) Int. Cl.
*H01L 27/00*  (2006.01)
*H01L 29/00*  (2006.01)
(Continued)

(52) U.S. Cl.
CPC ........ *H01L 27/1251* (2013.01); *H01L 27/127* (2013.01); *H01L 27/1225* (2013.01);
(Continued)

(58) Field of Classification Search
CPC ............. H01L 27/1237; H01L 27/1288; H01L 27/1251; H01L 27/1225; H01L 27/12;
(Continued)

(56) References Cited

U.S. PATENT DOCUMENTS 10,297,622 B2* 5/2019 Na .................. H01L 29/78672
2009/0278121 A1* 11/2009 Kakkad ................ H01L 31/147
257/E33.044
2018/0061868 A1* 3/2018 Na .................. H01L 29/78672

OTHER PUBLICATIONS

Mark Stewart et al., "Polysilicon TFT Technology for Active Matrix OLED Displays", IEEE Transactions on Electron Devices, vol. 48, No. 5, May 2001.

(Continued)

*Primary Examiner* — Nikolay K Yushin
(74) *Attorney, Agent, or Firm* — Lex IP Meister, PLLC

(57) ABSTRACT

A thin film transistor panel according to an exemplary embodiment includes: a substrate; a first transistor disposed on the substrate and including a first semiconductor layer including a low temperature polysilicon and a first control electrode overlapping the first semiconductor layer; a second transistor disposed on the substrate and including a second semiconductor layer including an oxide semiconductor and a second control electrode overlapping the second semiconductor layer; a first gate insulation layer disposed between the first semiconductor layer and the first control electrode of the first transistor and including a first insulation layer and a second insulation layer; and a second gate insulation layer disposed between the second semiconductor layer and the second control electrode of the second transistor and including the second insulation layer, wherein the density of the first insulation layer may be higher than the density of the second insulation layer, the first semiconductor layer of the first transistor may be in contact with the first insulation layer, and the second semiconductor layer of the second transistor may be in contact with the second insulation layer.

14 Claims, 39 Drawing Sheets

(51) Int. Cl.
     *H01L 27/12*     (2006.01)
     *H01L 29/24*     (2006.01)
     *H01L 29/786*    (2006.01)
     *H01L 29/66*     (2006.01)
(52) U.S. Cl.
     CPC ...... *H01L 27/1237* (2013.01); *H01L 27/1288* (2013.01); *H01L 29/24* (2013.01); *H01L 29/66757* (2013.01); *H01L 29/66969* (2013.01); *H01L 29/7869* (2013.01); *H01L 29/78675* (2013.01); *H01L 29/78696* (2013.01)
(58) Field of Classification Search
     CPC ........... H01L 29/7869; H01L 29/78675; H01L 29/24; H01L 29/66969; H01L 29/66757; H01L 29/78696
     See application file for complete search history.

(56) References Cited

OTHER PUBLICATIONS

Sang-Jin Lee et al., "A Novel Five-Photomask Low-Temperature Polycrystalline Silicon CMOS Structure for AMLCD Application", IEEE Trans. Electron Devices, vol. 57, No. 9, Sep. 2010, 2324.
Moojin Kim et al., "16.2: World-Best Performance LTPS TFTs with Robust Bending Properties on AMOLED Displays", SID 11 Digest 2011, 42, 194.
Nobutake Nodera et al., "Novel LTPS technology for large substrate", Journal of the SID 2016, 24, 394. DOI # 10.1002/jsid.455.
Carlin Vieri et al., "An 18 megapixel 4.3" 1443 ppi 120 Hz OLED display for wide field of view high acuity head mounted displays", Journal of the SID 2018, 26, 314. DOI # 10.1002/jsid.658.
Kenji Nomura et al., "Room-temperature fabrication of transparent flexible thin-film transistors using amorphous oxide semiconductors", Nature, vol. 432, Nov. 25, 2004, 448.
E. Fortunato et al., "Oxide Semiconductor Thin-Film Transistors: A Review of Recent Advances", Adv. Mater. 2012, 24, 2945-2986. DOI: 10.1002/adma.201103228.
Gerwin Gelinck et al., "Organic Transistors in Optical Displays and Microelectronic Applications", Adv. Mater. 2010, 22, 3778-3798. DOI: 10.1002/adma.200903559.
Mallory Mativenga et al., "Fully Transparent and Rollable Electronics", ACS Appl. Mater. Interfaces 2015, 7, 1578-1585, Dec. 19, 2014. DOI: 10.1021/am506937s.
Piero Migliorato et al., "Light/negative bias stress instabilities in indium gallium zinc oxide thin film transistors explained by creation of a double donor", Applied Physics Letters 101, 123502 (2012). doi: 10.1063/1.4752238.
Ji Yong Noh et al., "Development of 55" 4K UHD OLED TV employing the internal gate IC with high reliability and short channel IGZO TFTs", Journal of the SID 2018, 26, 36. DOI # 10.1002/jsid.628.
Kyung Min Kim et al., "Bezel free design of organic light emitting diode display via a-InGaZnO gate driver circuit integration within active array", J Soc Inf Display. 2019;27:514-522. DOI: 10.1002/jsid.827.
Guanghai Jin et al., "Simple Fabrication of a Three-Dimensional CMOS Inverter Using p-Type Poly-Si and n-Type Amorphous Ga—In—Zn—O Thin-Film Transistors", IEEE Electron Device Letters, vol. 32, No. 9, Sep. 2011.
ChangDong Chen et al., "Integrating Poly-Silicon and InGaZnO Thin-Film Transistors for CMOS Inverters", IEEE Transactions on Electron Devices, vol. 64, No. 9, Sep. 2017.
Hyunho Kim et al., "A High-Gain Inverter With Low-Temperature Poly-Si Oxide Thin-Film Transistors", IEEE Electron Device Letters, vol. 40, No. 3, Mar. 2019.
Abidur Rahaman et al., "High Speed and Wider Swing, Level Shifter Using Low-Temperature Poly-Silicon Oxide TFTs", IEEE Electron Device Letters, vol. 40, No. 11, Nov. 2019.
Ting-Kuo Chang et al., "LTPO TFT Technology for AMOLEDs", SID 2019 Digest 2019, 50, 545.
J. Batey et al., "Lowtemperature deposition of highquality silicon dioxide by plasma enhanced chemical vapor deposition", J. Appl. Phys. 60, 3136 (1986); doi: 10.1063/1.337726.
Kikuo Ono et al., "Analysis of Current-Voltage Characteristics of Low-Temperature-Processed Polysilicon Thin-Film Transistors", IEEE Transactions on Electron Devices, vol. 39. No. 4, Apr. 1992.
Hideki Tanaka et al., "Spin-on n-Type Silicon Films Using Phosphorous-doped Polysilanes", Japanese Journal of Applied Physics, vol. 46, No. 36, 2007, pp. L886-L888. DOI: 10.1143/JJAP.46.L886.
Kazuhiro Shimizu et al., "High-Mobility Bottom-Gate Thin-Film Transistors with Laser-Crystallized and Hydrogen-Radical-Annealed Polysilicon Films", Jpn. J. Appl. Phys., vol. 30, No. 12B, Dec. 1991, pp. 3704-3709.
Dong-Min Kim et al., "Dopant activation after ion shower doping for the fabrication of low-temperature poly-Si TFTs", Thin Solid Films 475 (2005) 342- 347. doi:10.1016/j.tsf.2004.07.034.
Ching-Fa Yeh et al., "Application of Plasma Immersion Ion Implantation Doping to Low-Temperature Processed Poly-Si TFT's", IEEE Electron Device Letters, vol. 19, No. 11, Nov. 1998.
B.S. So et al., "Application of Field-Enhanced Rapid Thermal Annealing to Activation of Doped Polycrystalline Si Thin Films", Mater. Res. Soc. Symp. Proc. 2005, 862, A2.4.
Kazushige Takechi et al., "Temperature-Dependent Transfer Characteristics of Amorphous InGaZnO4 Thin-Film Transistors", Japanese Journal of Applied Physics 48 (2009) 011301.
Ayumu Sato et al., "Amorphous In—Ga—Zn—O coplanar homojunction thin-film transistor", Applied Physics Letters 94, 133502 (2009); doi: 10.1063/1.3112566.
Dong Han Kang et al., "Self-Aligned Coplanar a-IGZO TFTs and Application to High-Speed Circuits", IEEE Electron Device Letters, vol. 32, No. 10, Oct. 2011.
Abidur Rahaman et al., "Effect of Doping Fluorine in Offset Region on Performance of Coplanar a-IGZO TFTs", IEEE Electron Device Letters, vol. 39, No. 9, Sep. 2018.
Chang-Ho Tseng et al., "Effects of Excimer Laser Dopant Activation on Low Temperature Polysilicon Thin-Film Transistors with Lightly Doped Drains", Electrochemical and Solid-State Letters, 4 (11) G94-G97 (2001). DOI: 10.1149/1.1405997.
Takashi Noguchi et al., "Effective Dopant Activation in Silicon Film Using Excimer Laser Annealing for High-Performance Thin Film Transistors", Japanese Journal of Applied Physics, vol. 47, No. 3, 2008, pp. 1858-1861. DOI: 10.1143/JJAP.47.1858.
Ki Hyung Kim et al., "Continuous wave laser dopant activation of ion doped poly-Si films", Current Applied Physics 10 (2010) S226-S229. doi: 10.1016/j.cap.2009.11.055.
Kenji Nomura et al., "Amorphous Oxide Semiconductors for High-Performance Flexible Thin-Film Transistors", Japanese Journal of Applied Physics, vol. 45, No. 5B, 2006, pp. 4303-4308. DOI: 10.1143/JJAP.45.4303.
Toshio Kamiya et al., "Electronic structure of oxygen deficient amorphous oxide semiconductor a-InGaZnO4-x: Optical analyses and first-principle calculations", p hys. stat. sol. (c) 5, No. 9, 3098-3100 (2008). DOI 10.1002/pssc.200779300.
Keisuke Ide et al., "Effects of Base Pressure on Growth and Optoelectronic Properties of Amorphous In—Ga—Zn—O Ultralow Optimum Oxygen Supply and Bandgap Widening", Phys. Status Solidi A 2019, 216, 1700832. DOI: 10.1002/pssa.201700832.
Seonghyun Jin et al., "Lateral Grain Growth of Amorphous Silicon Films With Wide Thickness Range by Blue Laser Annealing and Application to High Performance Poly-Si TFTs", IEEE Electron Device Letters, vol. 37, No. 3, Mar. 2016.
Seonghyun Jin et al., "Low temperature polycrystalline silicon with single orientation on glass by blue laser annealing", Thin Solid Films 616 (2016) 838-841. http://dx.doi.org/10.1016/j.tsf.2016.10.026.
Young Hun Jung et al., "Sequential Lateral Crystallization of Amorphous Silicon on Glass by Blue Laser Annealing for High

(56) References Cited

OTHER PUBLICATIONS

Mobility Thin-Film Transistors", Thin Solid Films 2019, 681, 93. https://doi.org/10.1016/j.tsf.2019.04.023.

Min Li et al., "Indium-Gallium-Zinc-Oxide Thin-Film Transistors Based on Homojunctioned Structure Fabricated With a Self-Aligned Process", Journal of Display Technology, vol. 11, No. 7, Jul. 2015.

Di Geng et al., "High-Speed and Low-Voltage-Driven Shift Register With Self-Aligned Coplanar a-IGZO TFTs", IEEE Electron Device Letters, vol. 33, No. 7, Jul. 2012.

Su Hwa Ha et al., "Channel Length Dependent Bias-Stability of Self-Aligned Coplanar a-IGZO TFTs", Journal of Display Technology, vol. 9, No. 12, Dec. 2013.

Sae-Young Hong et al., "Study on the Lateral Carrier Diffusion and Source-Drain Series Resistance in Self-Aligned Top-Gate Coplanar InGaZnO Thin-Film Transistors", Scientific Reports 2019, 9, 6588. https://doi.org/10.1038/s41598-019-43186-7.

Eizo Ohno et al., "Fabrication of Self-Aligned Aluminum Gate Polysilicon Thin-Film Transistors Using Low-Temperature Crystallization Process", Jpn. J. Appl. Phys. 1994, 33, 635.

Genshiro Kawachi et al., "Application of Ion Doping and Excimer Laser Annealing to Fabrication of Low-Temperature Polycrystalline Si Thin-Film Transistors", Jpn. J. Appl. Phys. 1994, 33, 2092.

Chun-Chien Tsai et al., "High-Performance Self-Aligned Bottom-Gate Low-Temperature Poly-Silicon Thin-Film Transistors With Excimer Laser Crystallization", IEEE Electron Device Letters, vol. 28, No. 7, Jul. 2007.

\* cited by examiner

THIN FILM TRANSISTOR PANEL, ELECTRIC DEVICE INCLUDING THE SAME, AND MANUFACTURING METHOD THEREOF

CROSS-REFERENCE TO RELATED APPLICATION

This application claims priority to and the benefit of Korean Patent Application No. 10-2020-0001553 filed in the Korean Intellectual Property Office on Jan. 6, 2020, the entire contents of which are incorporated herein by reference.

BACKGROUND

1. Field

The present disclosure relates to a thin film transistor panel, an electronic device including the same, and a manufacturing method thereof. More particularly, the described technology relates generally to thin film transistors including low temperature polysilicon and an amorphous oxide semiconductor, an electronic device including the same, and a manufacturing method thereof.

2. Description of the Related Art

A low temperature polysilicon (LTPS) thin film transistor has high mobility and is used in a display device. In addition, thin film transistors including amorphous oxide semiconductors have low leakage current and high stability and are used in high-resolution display devices.

Recently, interest in using a low temperature polysilicon thin film transistor and an oxide thin film transistor in one device is increasing.

However, since manufacturing processes of a low temperature polysilicon thin film transistor and an oxide thin film transistor are different, it is difficult to form them simultaneously in one device, and when they are formed simultaneously, performance of each semiconductor may be deteriorated.

The above information disclosed in this Background section is only for enhancement of understanding of the background of the described technology, and therefore it may contain information that does not form the prior art that is already known in this country to a person of ordinary skill in the art.

SUMMARY

An exemplary embodiment is to provide thin film transistors disposed on one substrate and each including a low temperature polysilicon thin film transistor and an amorphous oxide thin film transistor, an electronic device including the same, and a manufacturing method thereof.

It is apparent that the object of the present invention is not limited to the above-described object, but may be variously extended within a range without departing from the spirit and scope of the present invention.

A thin film transistor panel according to an exemplary embodiment includes: a substrate; a first transistor disposed on the substrate and including a first semiconductor layer including a low temperature polysilicon and a first control electrode overlapping the first semiconductor layer; a second transistor disposed on the substrate and including a second semiconductor layer including an oxide semiconductor and a second control electrode overlapping the second semiconductor layer; a first gate insulation layer disposed between the first semiconductor layer and the first control electrode of the first transistor and including a first insulation layer and a second insulation layer; and a second gate insulation layer disposed between the second semiconductor layer and the second control electrode of the second transistor and including the second insulation layer, wherein the density of the first insulation layer may be higher than the density of the second insulation layer, the first semiconductor layer of the first transistor may be in contact with the first insulation layer, and the second semiconductor layer of the second transistor may be in contact with the second insulation layer.

The second semiconductor layer may include IGZO.

The first semiconductor layer may include a first channel region, and a first input region and a first output region disposed on both sides of the first channel region, the second semiconductor layer may include a second channel region, and a second input region and a second output region disposed on both sides of the second channel region, the first input region and the first output region may be doped with a first impurity, and the second input region and the second output region may be doped with a second impurity of a different type from the first impurity.

The first impurity may be a P-type impurity, and the second impurity may be an N-type impurity.

The first channel region of the first semiconductor layer may be aligned vertically with the first control electrode, and the second channel region of the second semiconductor layer may be aligned vertically with the second control electrode.

An electronic device according to an exemplary embodiment includes: a substrate; a first transistor disposed on the substrate and including a first semiconductor layer including a low temperature polysilicon, a first control electrode overlapping the first semiconductor layer, and a second gate insulation layer disposed between the second semiconductor layer and the second control electrode and including a second insulation layer; a second transistor disposed on the substrate and including a second semiconductor layer including an oxide semiconductor, a second control electrode overlapping the second semiconductor layer, and a second gate insulation layer disposed between the second semiconductor layer and the second control electrode of the second transistor and including a second insulation layer; an input terminal connected to the first control electrode and the second control electrode; a high voltage input terminal connected to a first input electrode of the first transistor; a low voltage input terminal connected to a second input electrode of the second transistor; and an output terminal connected to the first output electrode of the first transistor and the second output electrode of the second transistor, wherein the density of the first insulation layer may be higher than the density of the second insulation layer, and the first semiconductor layer of the first transistor may be in contact with the first insulation layer, and the second semiconductor layer of the second transistor is in contact with the second insulation layer.

The first semiconductor layer of the first transistor may include a region doped with a P-type impurity, and the second semiconductor layer of the second transistor may include a region doped with an N-type impurity.

The channel ratio (W/L) of the second transistor may be two times or more of the channel ratio (W/L) of the first transistor.

A manufacturing method of a thin film transistor panel according to an exemplary embodiment includes: forming a first semiconductor layer including a low temperature polysilicon on a substrate; forming a first insulation layer on the first semiconductor layer; forming a second semiconductor layer including an oxide semiconductor on the first insulation layer; forming a second insulation layer on the first insulation layer and the second semiconductor layer; forming a conductor pattern overlapping the first semiconductor layer and a second control electrode overlapping the second semiconductor layer, and forming a second channel region, and a second input region and a second output region disposed on both sides of the second channel region in the second semiconductor layer; and forming a first control electrode overlapping the first semiconductor layer and forming a first channel region, and a first input region and a first output region disposed on both sides of the first channel region in the first semiconductor layer, wherein the deposition temperature of the first insulation layer may be higher than the deposition temperature of the second insulation layer.

The forming of the conductor pattern, the second control electrode, the second input region, and the second output region may include: depositing a metal layer on the second insulation layer; forming a first photosensitive layer pattern covering all the first semiconductor layer and disposed at a position overlapping the second control electrode of the second semiconductor layer; etching the metal layer, the second insulation layer, and the first insulation layer by using the first photosensitive layer pattern as a mask to form the conductor pattern overlapping the first semiconductor layer and the second control electrode overlapping the second semiconductor layer; and doping a first impurity by using the first photosensitive layer pattern, the conductor pattern, and the second control electrode as a mask to form the second input region and the second output region.

The forming of the first control electrode, the first input region, and the first output region may include: forming a second photosensitive layer pattern covering all the second semiconductor layer and disposed at a position overlapping the first control electrode of the first semiconductor layer; etching the conductor pattern, the second insulation layer, and the first insulation layer by using the second photosensitive layer pattern as a mask to form the first control electrode overlapping the first semiconductor layer; and doping a second impurity by using the second photosensitive layer pattern and the first control electrode as a mask to form the first input region and the first output region.

The manufacturing method of the thin film transistor panel may further include activating the second impurity doped in the first input region and the first output region.

A laser may be irradiated in the activation.

The first impurity may be a P-type impurity, and the second impurity may be an N-type impurity.

The first insulation layer may be formed in a process temperature of 350° C. or more, and the second insulation layer may be formed in a process temperature of 250° C. or less.

The second semiconductor layer may be formed of an oxide semiconductor including IGZO.

According to an exemplary embodiment, the thin film transistors each including a low temperature polysilicon thin film transistor and an amorphous oxide thin film transistor are positioned on one substrate, and these thin film transistors may be simultaneously formed at a low manufacturing cost without the damage of the channel layer.

It is apparent that the present invention is not limited to the above-described effects, and may be variously extended within a range without departing from the spirit and scope of the present invention.

DETAILED DESCRIPTION

Figure 1:
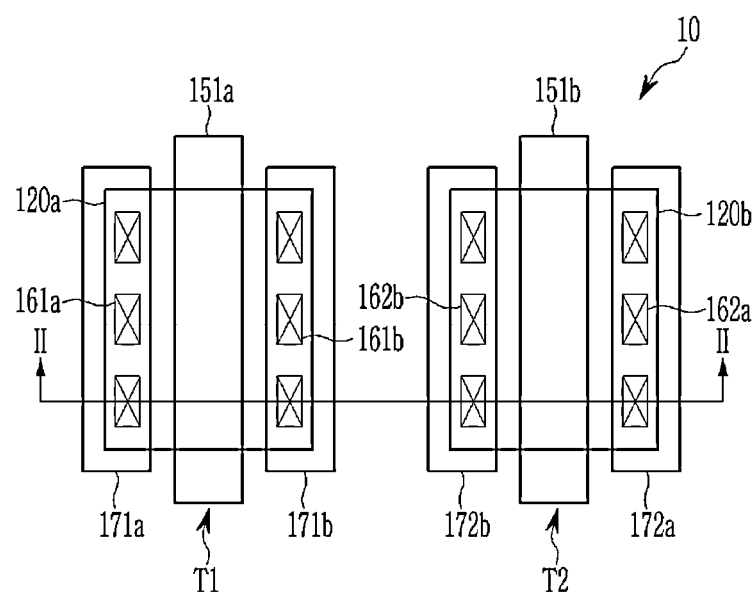
FIG. 1 is a layout view of a thin film transistor panel according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clearly describe the present invention, portions that are not connected with the description will be omitted. Like reference numerals designate like elements throughout the specification.

In addition, the size and thickness of each configuration shown in the drawings are arbitrarily shown for understanding and ease of description, but the present invention is not limited thereto. In the drawings, the thickness of layers, films, panels, regions, etc., are exaggerated for clarity. In the drawings, the thickness of layers, films, panels, regions, etc., are exaggerated for the convenience of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, but does not essentially mean positioning on the upper side of the object portion based on a gravity direction.

In addition, unless explicitly described to the contrary, the word "comprise", and variations such as "comprises" or "comprising", will be understood to imply the inclusion of stated elements but not the exclusion of any other elements.

Further, in the specification, the phrase "on a plane" means viewing the main surface (e.g., a surface where an image is displayed) of the object portion from the top, and the phrase "on a cross-section" means viewing a cross-section of which the object portion is vertically cut from the side.

Now, preferable exemplary embodiments are described in detail with reference to accompanying drawings. The same reference numerals are used for the same components in the drawings, and duplicate descriptions of the same components are omitted.

A structure of a transistor according to an exemplary embodiment is described with reference to FIG. 1 and FIG. 2. FIG. 1 is a layout view of a thin film transistor panel according to an exemplary embodiment, and FIG. 2 is a cross-sectional view taken along a line II-II of FIG. 1.

Figure 2:
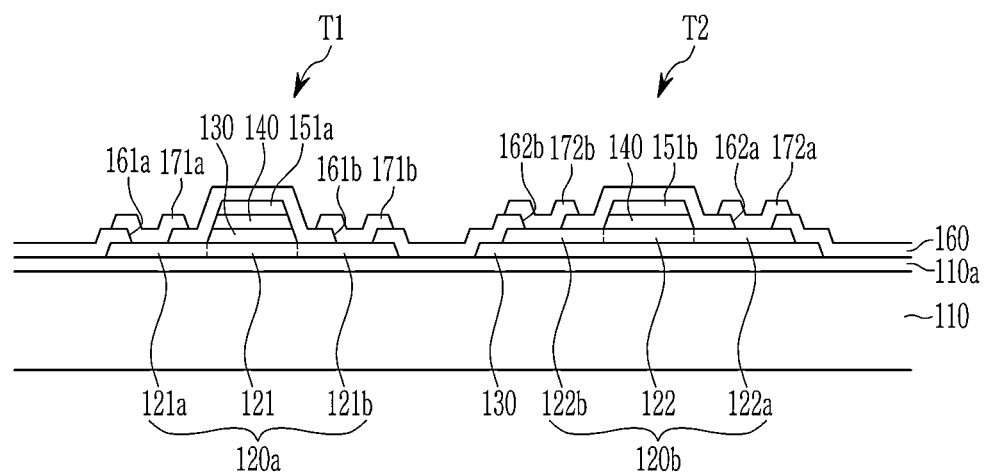
FIG. 2 is a cross-sectional view taken along a line II-II of FIG. 1.

Referring to FIG. 1 and FIG. 2, a thin film transistor panel 10 according to an exemplary embodiment includes a first transistor T1 and a second transistor T2 disposed on a substrate 110.

A barrier layer 110a is disposed between the substrate 110, and the first transistor T1 and the second transistor T2. The barrier layer 110a may include a single layer of an insulation layer such as a silicon nitride (SiNx) and a silicon oxide (SiOx) or a plurality of multilayers in which a silicon nitride (SiNx) and a silicon oxide (SiOx) are disposed. The barrier layer 110a prevents unwanted components such as impurity or moisture from infiltrating the first transistor T1 and the second transistor T2 positioned on the substrate 110 from the outside.

The first transistor T1 includes a first semiconductor layer 120a, a first insulation layer 130 disposed on the first semiconductor layer 120a, a second insulation layer 140 disposed on the first insulation layer 130, a first control electrode 151a disposed on the second insulation layer 140, a third insulation layer 160 disposed on the first control electrode 151a, and a first input electrode 171a and a first output electrode 171b disposed on the third insulation layer 160 and respectively connected to a first input region 121a and a first output region 121b of the first semiconductor layer 120a.

The first semiconductor layer 120a includes a low temperature polysilicon (LTPS: low-temperature polycrystalline silicon). The first semiconductor layer 120a includes a first channel region 121, and a first input region 121a and a first output region 121b positioned on both sides of the first channel region 121. The first channel region 121 of the first semiconductor layer 120a may be a region in which an impurity is not doped, and the first input region 121a and the first output region 121b of the first semiconductor layer 120a may be regions doped with the impurity. A channel of the first transistor T1 is formed in the first channel region 121 of the first semiconductor layer 120a.

The first insulation layer 130 is an insulation layer deposited at a high temperature. For example, the first insulation layer 130 may be a silicon oxide layer ($SiO_2$) formed under a process temperature of about 350° C. or higher. More specifically, it may be a silicon oxide layer formed under a process temperature of about 420° C.

The second insulation layer 140 is an insulation layer deposited at a low temperature. For example, the second insulation layer 140 may be a silicon oxide layer ($SiO_2$) formed under a process temperature of about 250° C. or less. More specifically, the second insulation layer 140 may be a silicon oxide layer formed under a process temperature of about 200° C.

The density of the first insulation layer 130 and the second insulation layer 140 may be different. For example, the first insulation layer 130 may be deposited at a high temperature, the deposition speed is slow but the density may be relatively high, and the second insulation layer 140 is deposited at a low temperature, the deposit speed may be fast, but the density may be relatively low. As such, the density of the first insulation layer 130 may be higher than that of the second insulation layer 140.

The first insulation layer 130 and the second insulation layer 140 are positioned between the first semiconductor layer 120a of the first transistor T1 and the first control electrode 151a, and may be a gate insulation layer of the first transistor T1.

The first control electrode 151a is a single layer or multiple layers including a low-resistance material or a material strong against corrosion such as molybdenum (Mo), aluminum (Al), titanium (Ti), copper (Cu), nickel (Ni), or their alloys.

The third insulation layer 160 has a first contact hole 161a and a second contact hole 161b respectively overlapping the first input region 121a and the first output region 121b of the first semiconductor layer 120a. The third insulation layer 160 may be a single layer including a silicon oxide (SiOx) or a silicon nitride (SiNx), or a multilayer in which they are disposed.

The first input electrode 171a and the first output electrode 171b are connected to the first input region 121a and the first output region 121b of the first semiconductor layer 120a through the first contact hole 161a and the second contact hole 161b of the third insulation layer 160, respectively.

The first input electrode 171a and the first output electrode 171b may be a single layer or multiple layers including low-resistance materials or materials strong against corrosion such as molybdenum (Mo), aluminum (Al), titanium (Ti), copper (Cu), nickel (Ni), or their alloys.

The second transistor T2 includes the first insulation layer 130 disposed on the substrate 110, a second semiconductor layer 120b disposed on the first insulation layer 130, the second insulation layer 140 disposed on the second semiconductor layer 120b, a second control electrode 151b disposed on the second insulation layer 140, the third insulation layer 160 disposed on the second control electrode 151b, and a second input electrode 172a and a second output electrode 172b disposed on the third insulation layer 160 and respectively connected to the second input region 122a and the second output region 122b of the second semiconductor layer 120b.

The first insulation layer 130 is an insulation layer deposited at a high temperature. For example, the first insulation layer 130 may be a silicon oxide layer ($SiO_2$) formed under a process temperature of about 350° C. or higher. More specifically, it may be a silicon oxide layer formed under a process temperature of about 420° C.

The second semiconductor layer 120b may include an amorphous oxide semiconductor layer. For example, the second semiconductor layer 120b may be an oxide semiconductor including indium (In), gallium (Ga), and zinc (Zn), and may be indium gallium zinc oxide (IGZO). The second semiconductor layer 120b includes a second channel region 122, and a second input region 122a and a second output region 122b positioned on both sides of the second channel region 122. The second channel region 122 of the second semiconductor layer 120b may be a region in which the impurity is not doped, and the second input region 122a and the second output region 122b of the second semiconductor layer 120b may be regions doped with an impurity. The channel of the second transistor T2 is formed in the second channel region 122 of the second semiconductor layer 120b.

The second insulation layer 140 positioned on the second semiconductor layer 120b is an insulation layer deposited at a low temperature. For example, the second insulation layer 140 may be a silicon oxide layer ($SiO_2$) formed under a process temperature of about 250° C. or less. More specifically, the second insulation layer 140 may be a silicon oxide layer formed at about 200° C.

The second insulation layer 140 may be positioned between the second semiconductor layer 120b of the second transistor T2 and the second control electrode 151b, and may be the gate insulation layer of the second transistor T2.

The second control electrode 151b may be a single layer or multiple layers including a low-resistance material or a material strong against corrosion such as molybdenum (Mo), aluminum (Al), titanium (Ti), copper (Cu), nickel (Ni), or alloys thereof.

The third insulation layer 160 has a third contact hole 162a and a fourth contact hole 162b overlapping the second input region 122a and the second output region 122b of the second semiconductor layer 120b, respectively. The third insulation layer 160 may be a single layer including a silicon oxide (SiOx) or a silicon nitride (SiNx), or a multilayer in which they are disposed.

The second input electrode 172a and the second output electrode 172b are connected to the second input region 122a and the second output region 122b of the second semiconductor layer 120b through the third contact hole 162a and the fourth contact hole 162b of the third insulation layer 160, respectively.

The second input electrode 172a and the second output electrode 172b may be a single layer or multiple layers including a low-resistance material or a material strong against corrosion such as molybdenum (Mo), aluminum (Al), titanium (Ti), copper (Cu), nickel (Ni), or alloys thereof.

Although not shown, a first input voltage line may be connected to the first input electrode 171a of the first transistor T1, a first output line may be connected to the first output electrode 171b of the first transistor T1, and the first output line may be connected to an electronic device. Similarly, a second input line may be connected to the second input electrode 172a of the second transistor T2, a second output line may be connected to the second output electrode 172b of the second transistor T2, and the second output line may be connected to the electronic device. For example, at least one of the first output electrode 171b of the first transistor T1 and the second output electrode 172b of the second transistor T2 may be electrically connected to a pixel electrode overlapping a liquid crystal layer of a liquid crystal display or a pixel electrode forming an organic light-emitting element of an organic light emitting display device.

As such, the first semiconductor layer 120a of the first transistor T1 positioned on one substrate 110 includes a low temperature polysilicon, and the second semiconductor layer 120b of the second transistor T2 includes an amorphous oxide semiconductor layer. In addition, the first insulation layer 130 and the second insulation layer 140 are positioned between the first semiconductor layer 120a and the first control electrode 151a of the first transistor T1, and the second insulation layer 140 is positioned between the second semiconductor layer 120b and the second control electrode 151b of the second transistor T2. That is, the first insulation layer 130 that is deposited at a high temperature and has the relatively high density and the second insulation layer 140 that is deposited at a low temperature and has the relatively low density are both disposed on first semiconductor layer 120a of the first transistor T1, but the second insulation layer 140 that is deposited at a low temperature and has the relatively low density is disposed and that deposited at a high temperature and has the relatively high density is not disposed on the second semiconductor layer 120b of the second transistor T2. In addition, the first semiconductor layer 120a including a low temperature polysilicon is in contact with the first insulation layer 130 that is deposited at a high temperature and has a relatively high density, and the second semiconductor layer 120b including an amorphous oxide semiconductor is in contact with the lower second insulation layer 140 that is deposited at a low temperature and has a relatively low density.

As such, the first insulation layer 130 deposited at a high temperature is disposed on the first semiconductor layer 120a of the first transistor T1 including the low temperature polysilicon, and the second insulation layer 140 deposited at a low temperature is disposed on the second semiconductor layer 120b of the second transistor T2 including the amorphous oxide semiconductor, accordingly the stability of the interface between the first semiconductor layer 120a of the first transistor T1 including a low temperature polysilicon and the first insulation layer 130 may be secured, and the damage caused by heat of the second semiconductor layer 120b of the second transistor T2 including the amorphous oxide semiconductor may be prevented.

The first input region 121a and the first output region 121b of the first semiconductor layer 120a may be doped with different impurities from the second input region 122a and the second output region 122b of the second semiconductor layer 120b. For example, the first input region 121a and the first output region 121b of the first semiconductor layer 120a may be doped with a P-type impurity, and the second input region 122a and the second output region 122b of the second semiconductor layer 120b may be doped with an N-type impurity. As such, the first input region 121a and the first output region 121b of the first transistor T1 and the second input region 122a and the second output region 122b of the second transistor T2 are doped with different types of impurity, thereby forming a CMOS type of transistor.

In addition, the first control electrode 151a of the first transistor T1 and the first channel region 121 of the first semiconductor layer 120a are aligned vertically, and similarly, the second control electrode 151b of the second transistor T2 and the second channel region 122 of the second semiconductor layer 120b are aligned vertically, the parasitic capacitance according to the overlapping between the first control electrode 151a of the first transistor T1, and the first input region 121a and the first output region 121b and the parasitic capacitance according to the overlapping between the second control electrode 151b of the second transistor T2, and the second input region 122a and the second output region 122b may be reduced.

Figure 7:
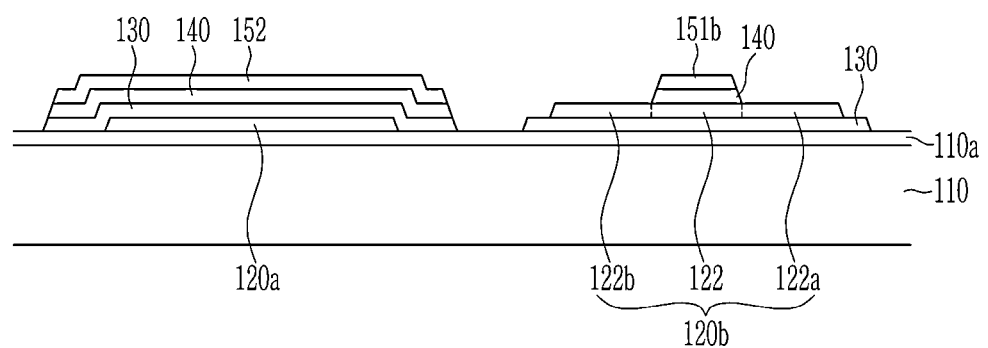
Figure 8A:
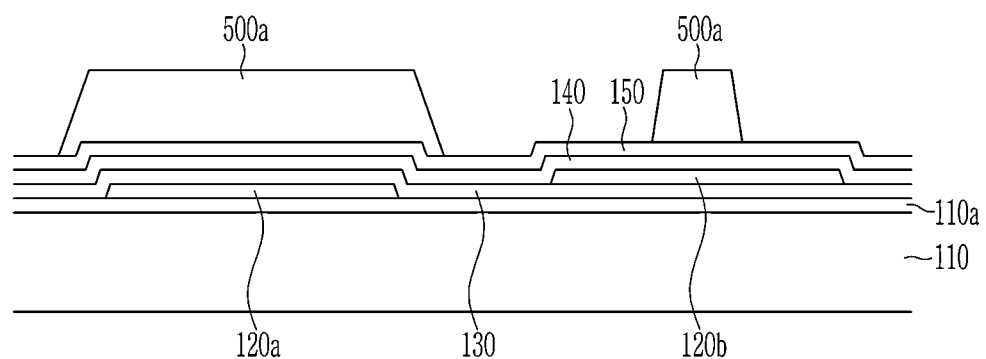
FIG. 8A to FIG. 8C are cross-sectional views sequentially showing a method of manufacturing a thin film transistor panel shown in FIG. 7.
Figure 8B:
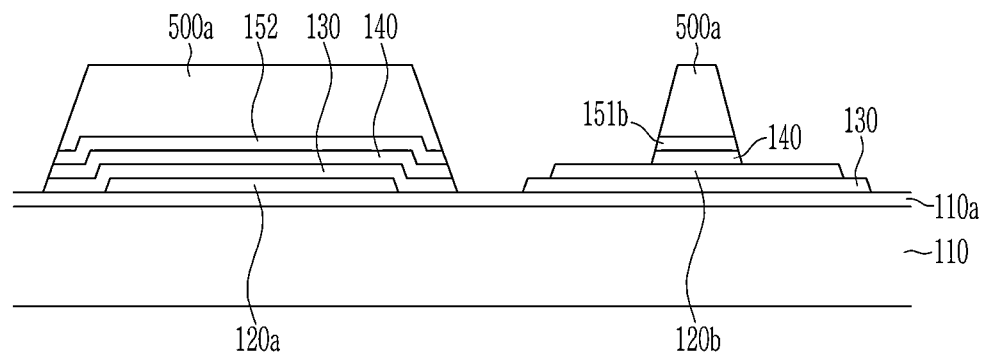
Figure 8C:
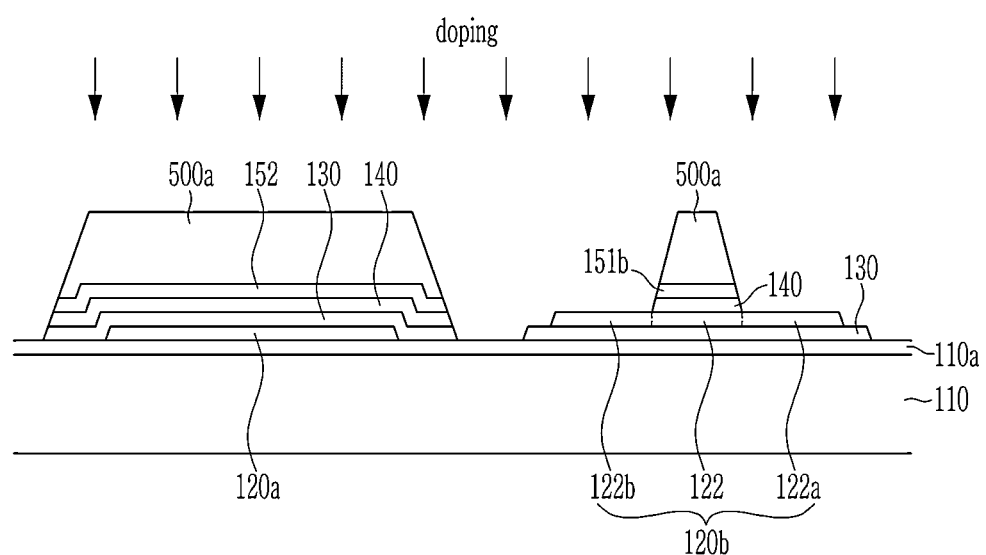
Figure 9:
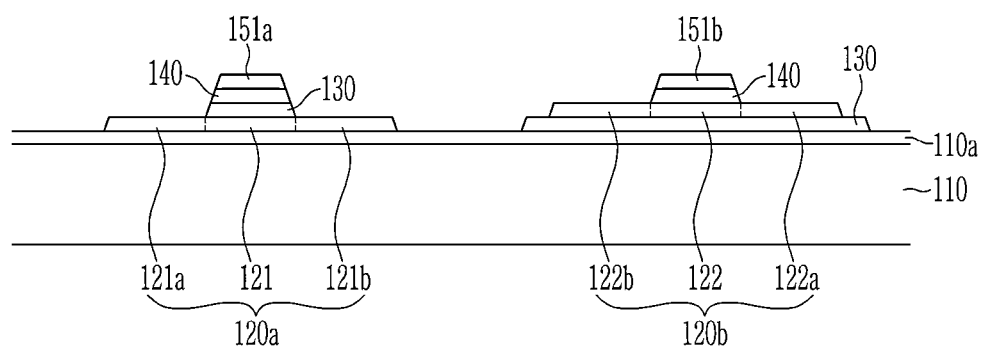
FIG. 9 is a cross-sectional view showing a part of a manufacturing method of a thin film transistor panel according to an exemplary embodiment.

Next, a manufacturing method of a thin film transistor panel according to an exemplary embodiment is described with reference to FIG. 3 to FIG. 11 as well as FIG. 1 and FIG. 2. FIG. 3 to FIG. 7 are cross-sectional views showing a part of a manufacturing method of a thin film transistor panel according to an exemplary embodiment, FIG. 8A to FIG. 8C are cross-sectional views sequentially showing a method of manufacturing a thin film transistor panel shown in FIG. 7, FIG. 9 is a cross-sectional view showing a part of a manufacturing method of a thin film transistor panel according to an exemplary embodiment, FIG. 10A to FIG. 10D are cross-sectional views sequentially showing a method of manufacturing a thin film transistor panel shown in FIG. 9, and FIG. 11 is a cross-sectional view showing a part of a manufacturing method of a thin film transistor panel according to an exemplary embodiment.

Figure 3:
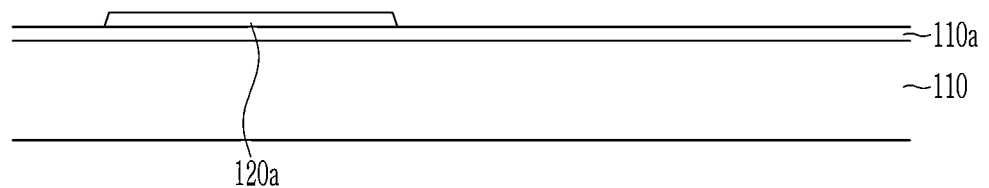
FIG. 3 to FIG. 7 are cross-sectional views showing a part of a manufacturing method of a thin film transistor panel according to an exemplary embodiment.

First, referring to FIG. 3, a barrier layer 110a is formed on a substrate 110, and a first semiconductor layer 120a is formed.

The first semiconductor layer 120a includes a low temperature polycrystalline silicon (LTPS). The first semiconductor layer 120a is formed through a photolithography and etching process using a first exposure mask after depositing an amorphous silicon layer on the barrier layer 110a and polycrystallizing it. For the polycrystallization of the amorphous silicon layer, after depositing the amorphous silicon on the barrier layer 110a, laser crystallization may be used at a relatively low process temperature, for example, about 400° C. to about 600° C.

Figure 4:
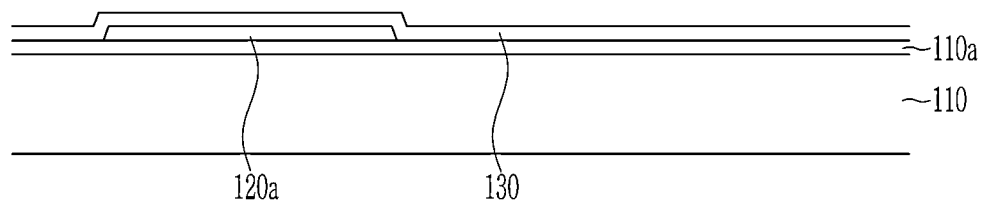

Referring to FIG. 4, a first insulation layer 130 is deposited on the first semiconductor layer 120a. The first insulation layer 130 is deposited at a high temperature. For example, the first insulation layer 130 may be formed by depositing a silicon oxide layer ($SiO_2$) at about 350° C. or higher, more specifically about 420° C.

Figure 5:
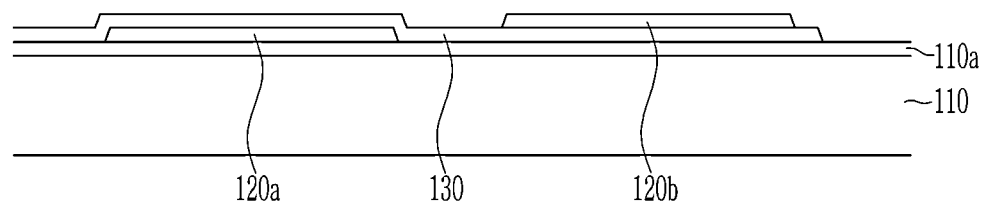

Referring to FIG. 5, a second semiconductor layer 120b is formed on the first insulation layer 130. The second semiconductor layer 120b is formed by depositing an amorphous oxide semiconductor layer constituting the first semiconductor layer 120a on the first insulation layer 130, and then a photolithography and etching process using a second exposure mask. For example, the second semiconductor layer 120b may be formed by stacking an oxide semiconductor containing indium (In), gallium (Ga), and zinc (Zn), and may be formed of, for example, indium gallium zinc oxide (IGZO).

Figure 6:
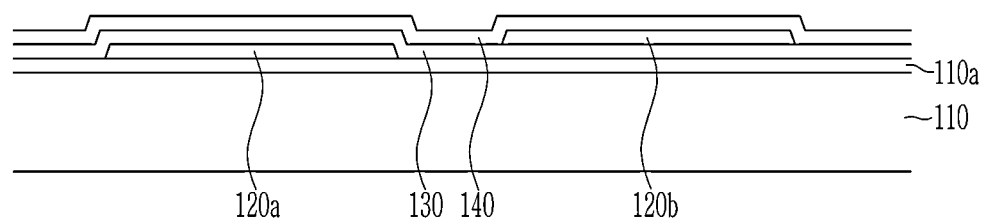

Referring to FIG. 6, a second insulation layer 140 is formed on the second semiconductor layer 120b. The second insulation layer 140 is deposited at a low temperature. For example, the second insulation layer 140 may be formed by depositing a silicon oxide layer ($SiO_2$) under a process temperature of about 250° C. or less, more specifically, a process temperature of about 200° C.

Next, as shown in FIG. 7, on the second insulation layer 140, a first conductor pattern 152 overlapping the first semiconductor layer 120a and a second control electrode 151b overlapping the second semiconductor layer 120b are formed and a first impurity is doped to the second semiconductor layer 120b to form a second channel region 122, and a second input region 122a and a second output region 122b positioned on both sides of the second channel region 122.

This will be described in more detail with reference to FIG. 8A and FIG. 8C.

As shown in FIG. 8A, after depositing a conductive layer 150 on the second insulation layer 140, and then a first photosensitive layer is deposited on the conductive layer 150 and is etched through photolithography using a third exposure mask to form a first photosensitive layer pattern 500a. The width of the first photosensitive layer pattern 500a overlapping the first semiconductor layer 120a may be wider than the width of the first semiconductor layer 120a, and the width of the first photosensitive layer pattern 500a overlapping the second semiconductor layer 120b may be the same as the width of the first control electrode 151a.

As shown in FIG. 8B, the conductive layer 150, the second insulation layer 140 and the first insulation layer 130 are sequentially etched by using the first photosensitive layer pattern 500a as a mask to form a first conductor pattern 152 overlapping the first semiconductor layer 120a and a second control electrode 151b overlapping the second semiconductor layer 120b.

Next, as shown in FIG. 8C, the first impurity is doped by using the first photosensitive layer pattern 500a, the first conductor pattern 152, and the second control electrode 151b as a mask to form the second channel region 122 of the second semiconductor layer 120b, and the second input region 122a and the second output region 122b disposed on both sides of the second channel region 122. At this time, the first semiconductor layer 120a is covered with the first insulation layer 130, the second insulation layer 140, the first conductor pattern 152, and the first photosensitive layer pattern 500a, so that the first impurity is not doped. In addition, since the first impurity is doped using the second control electrode 151b as a mask, the second channel region 122 of the second semiconductor layer 120b may be vertically aligned with the second control electrode 151b, whereby the second control electrode 151b, and the second input region 122a and the second output region 122b, may not overlap vertically. Accordingly, it is possible to reduce the parasitic capacitance according to the overlapping between the second control electrode 151b, and the second input region 122a and the second output region 122b. The first impurity may be an N-type impurity.

The first photosensitive layer pattern 500a is removed to form the structure shown in FIG. 7.

Next, as shown in FIG. 9, a first control electrode 151a overlapping the first semiconductor layer 120a is formed, and a second impurity is doped to the first semiconductor layer 120a and is annealed to form a first channel region 121, and a first input region 121a and a first output region 121b disposed on both sides of the first channel region 121.

Next, this will be described more in detail with reference to FIG. 10A to FIG. 10D.

Figure 10A:
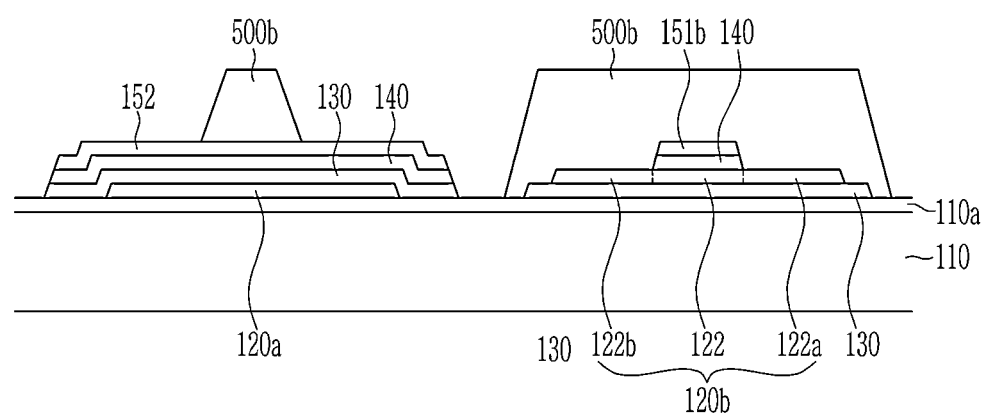
FIG. 10A to FIG. 10D are cross-sectional views sequentially showing a method of manufacturing a thin film transistor panel shown in FIG. 9.
Figure 11:
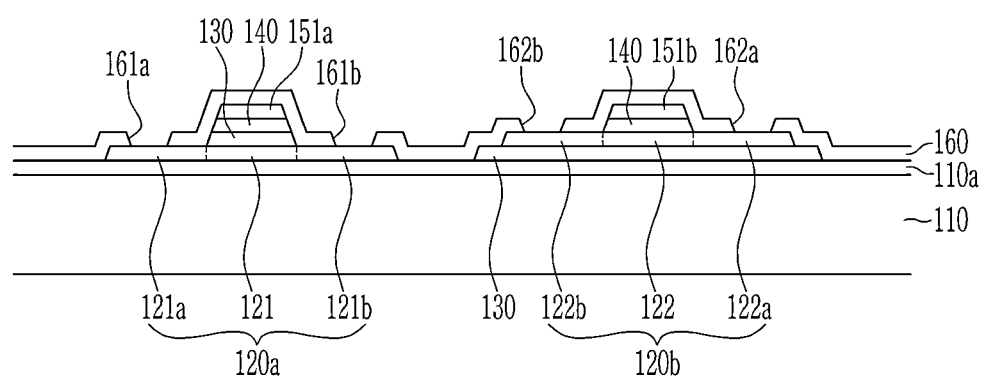
FIG. 11 is a cross-sectional view showing a part of a manufacturing method of a thin film transistor panel according to an exemplary embodiment.

Referring to FIG. 10A, a second photosensitive layer is deposited and is etched by photolithography using a fourth exposure mask to form a second photosensitive layer pattern 500b. The width of the second photosensitive layer pattern 500b overlapping the first semiconductor layer 120a may be the same as the width of the first control electrode 151a, and the width of the second photosensitive layer pattern 500b overlapping the second semiconductor layer 120b may be wider than the width of the second semiconductor layer 120b.

Figure 10B:
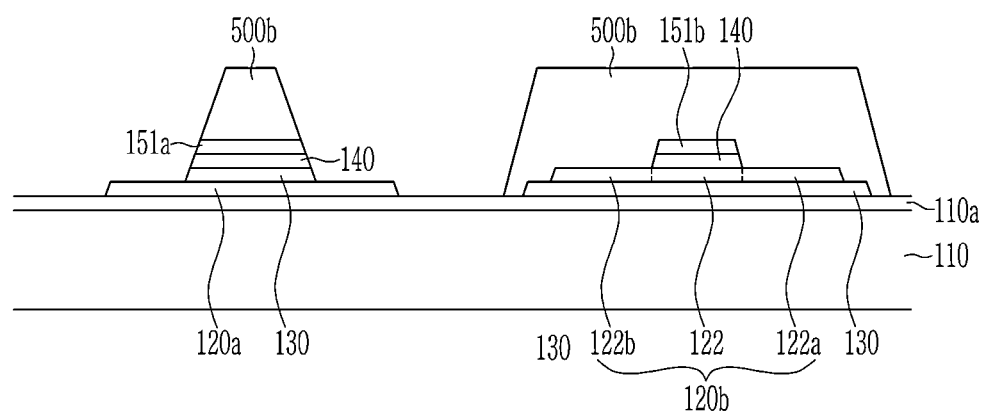

As shown in FIG. 10B, the first conductor pattern 152, the second insulation layer 140, and the first insulation layer 130 are sequentially etched by using the second photosensitive layer pattern 500b as a mask to form the first control electrode 151a overlapping the first semiconductor layer 120a.

Figure 10C:
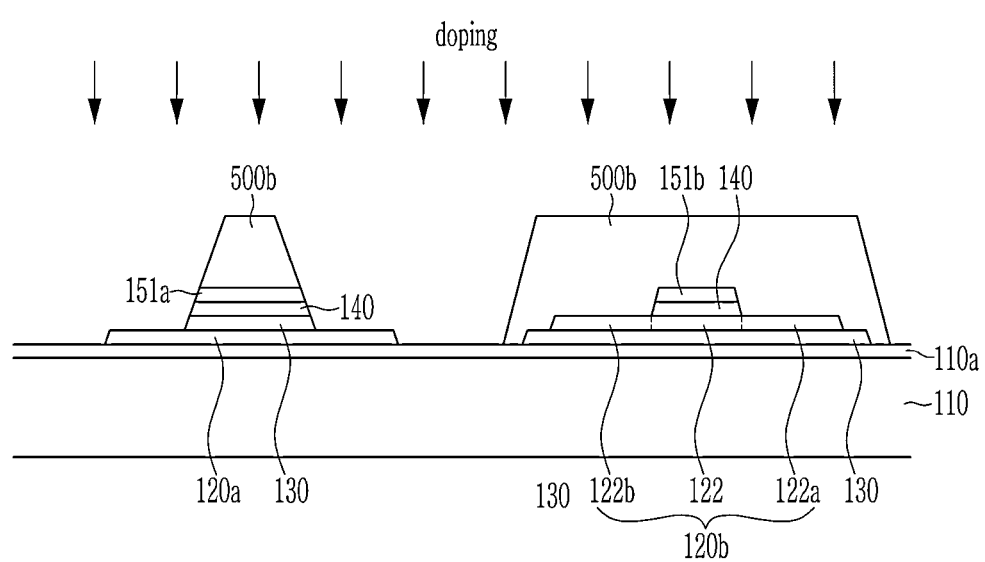

Next, as shown in FIG. 10C, the second impurity is doped to the first semiconductor layer 120a by using the second photosensitive layer pattern 500b and the first control electrode 151a as a mask to form the first channel region 121 of the first semiconductor layer 120a, and the first input region 121a and the first output region 121b disposed on both sides of the first channel region 121. At this time, since the first channel region 121 of the first semiconductor layer 120a is covered with the first control electrode 151a, the second impurity is not doped, and the second semiconductor layer 120b is covered with the second photosensitive layer pattern 500b, so the first impurity is not doped. In this way, since the second impurity is doped by using the first control electrode 151a as the mask and the first channel region 121 of the first semiconductor layer 120a may be vertically aligned with the first control electrode 151a, whereby the first control electrode 151a, and the first input region 121a and the first output region 121b, may not overlap vertically. Accordingly, the parasitic capacitance due to the overlapping between the first control electrode 151a, and the first input region 121a and the first output region 121b, may be reduced. The second impurity may be a P-type impurity.

Figure 10D:
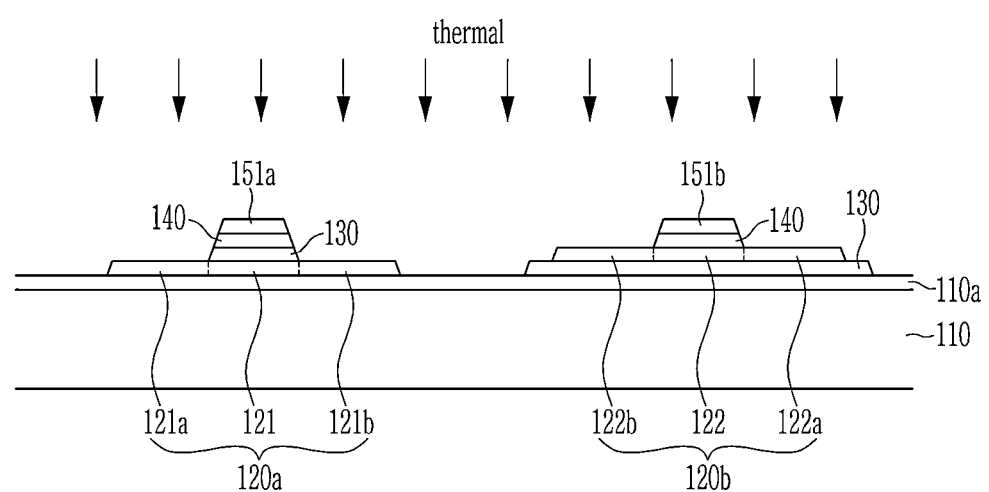

Next, after removing the second photosensitive layer pattern 500b, as shown in FIG. 10D, the first semiconductor layer 120a doped with the second impurity is heat-treated to activate the second impurity doped to the first semiconductor layer 120a, thereby forming the first channel region 121 of the first semiconductor layer 120a, and the first input region 121a and the first output region 121b disposed on both sides of the first channel region 121. At this time, the heat treatment uses a laser. More specifically, a blue laser having a wavelength of about 360 nm to 480 nm may be used. The first semiconductor layer 120a including the low-temperature polysilicon is activated by the blue laser, but the second semiconductor layer 120b including the amorphous oxide semiconductor does not absorb the blue laser and is not affected. If the second impurity doped to the first semiconductor layer 120a is activated through high temperature annealing processing as in the prior art, the second semiconductor layer 120b including the amorphous oxide semiconductor is also exposed to a high temperature, thereby the second semiconductor layer 120b may be damaged. However, according to the manufacturing method of the thin film transistor according to an exemplary embodiment, by activating the second impurity doped to the first semiconductor layer 120a using the blue laser, the first channel region 121 of the first semiconductor layer 120a and the first input region 121a and the first output region 121b disposed on both sides of the first channel region 121 may be formed without the damage of the second semiconductor layer 120b including the amorphous oxide semiconductor.

Next, as shown in FIG. 11, a third insulation layer 160 is deposited on the substrate 110 and is etched by the photolithography using a fifth exposure mask to form a first contact hole 161a and a second contact hole 161b respectively overlapping the first input region 121a and the first output region 121b of the first semiconductor layer 120a, and a third contact hole 162a and a fourth contact hole 162b respectively overlapping the second input region 122a and the second output region 122b of the second semiconductor layer 120b.

Finally, a metal layer is stacked on the substrate 110 and etched by the photolithography using a sixth exposure mask to form a second input electrode 172a and a second output electrode 172b respectively connected to the second input region 122a and the second output region 122b of the second semiconductor layer 120b, and a second input electrode 172a and a second output electrode 172b respectively connected to the second input region 122a and the second output region 122b of the second semiconductor layer 120b, which are disposed on the third insulation layer 160, thereby forming the thin film transistor panel including the first transistor T1 and the second transistor T2 shown in FIG. 1 and FIG. 2.

As above-described, according to the manufacturing method of the thin film transistor according to the exemplary embodiment, the first semiconductor layer 120a including the low temperature polysilicon is formed, the first insulation layer 130 deposited at the high temperature is formed thereon, and the second semiconductor layer 120b including the amorphous oxide semiconductor is formed, it is possible to prevent the second semiconductor layer 120b from being damaged by the high temperature while forming the first insulation layer 130 deposited at a high temperature with good interface characteristics on the first semiconductor layer 120a. Also, the first impurity is doped to the second semiconductor layer 120b after forming the second control electrode 151b overlapping the second semiconductor layer 120b, the second impurity is doped to the first semiconductor layer 120a after forming the first control electrode 151a overlapping the first semiconductor layer 120a, and the second impurity doped to the first semiconductor layer 120a is activated using the blue laser. In this way, while simultaneously forming the thin film transistor panel including the first transistor T1 including low temperature polysilicon and the second transistor T2 including the amorphous oxide semiconductor on one substrate by using the six exposure masks, the semiconductor of the first transistor T1 and the second transistor T2 may not be damaged.

In general, when simultaneously forming the transistor including the low temperature polysilicon and the transistor including the amorphous oxide semiconductor on one substrate, the transistor including the low temperature polysilicon is formed, and then the transistor including the amorphous oxide semiconductor is formed. In this case, an exposure mask for forming the transistor including the low temperature polysilicon and an exposure mask for forming the transistor including the amorphous oxide semiconductor are required, and approximately 10 or more exposure masks are used. As the number of the exposure masks increases in the manufacturing process, a manufacturing cost increases and a manufacturing step become complex.

As described above, according to the thin film transistor manufacturing method according to the exemplary embodiment, since the damage to the amorphous oxide semiconductor may be reduced while simultaneously forming the first transistor including the low temperature polysilicon and the second transistor including the amorphous oxide semiconductor on one substrate and it may be manufactured using six exposure masks, the manufacturing cost is reduced.

Figure 12:
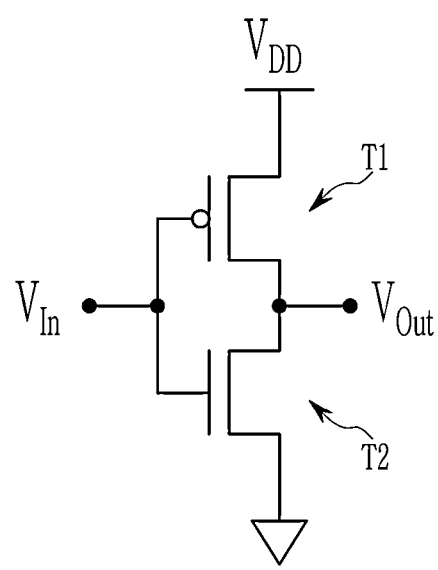
FIG. 12 is a circuit diagram of an electronic device including thin film transistors according to an exemplary embodiment.

Now, an electronic device including the thin film transistors according to the exemplary embodiment is described with reference to FIG. 12 to FIG. 14. FIG. 12 is a circuit diagram of an electronic device including thin film transistors according to an exemplary embodiment, FIG. 13 is a layout view of an electronic device including thin film transistors according to an exemplary embodiment, and FIG. 14 is a cross-sectional view taken along a line XIV-XIV of FIG. 13.

Referring to FIG. 12, the electronic device including the thin film transistors according to the exemplary embodiment is a CMOS-type inverter including the P-type first transistor T1 and the N-type second transistor T2.

Figure 13:
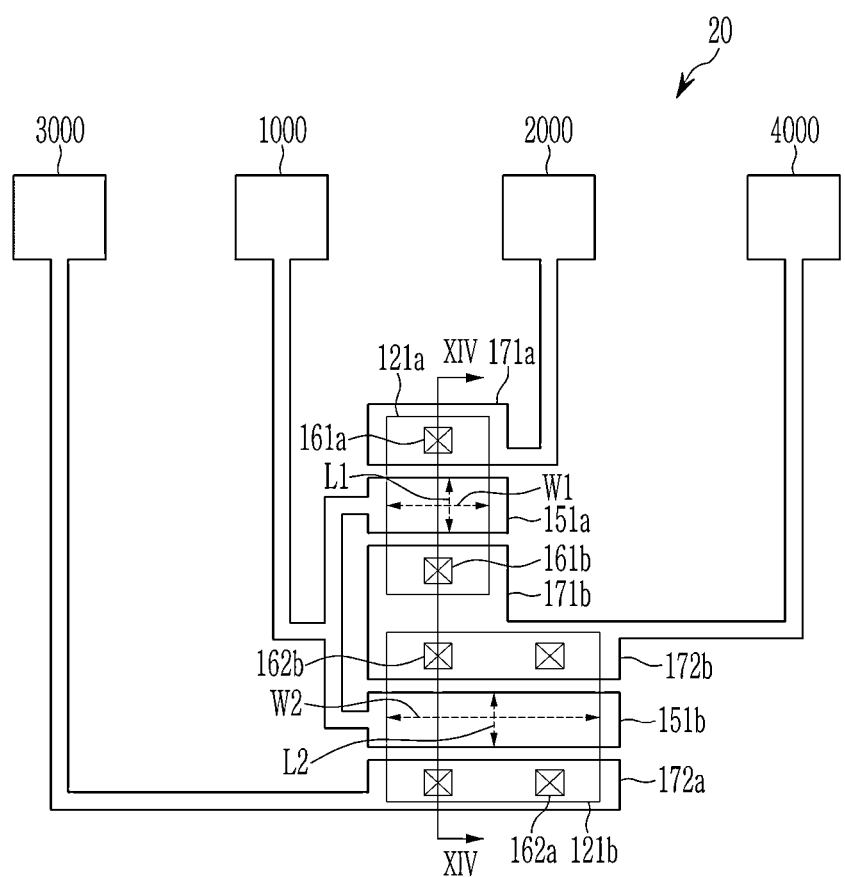
FIG. 13 is a layout view of an electronic device including thin film transistors according to an exemplary embodiment.
Figure 14:
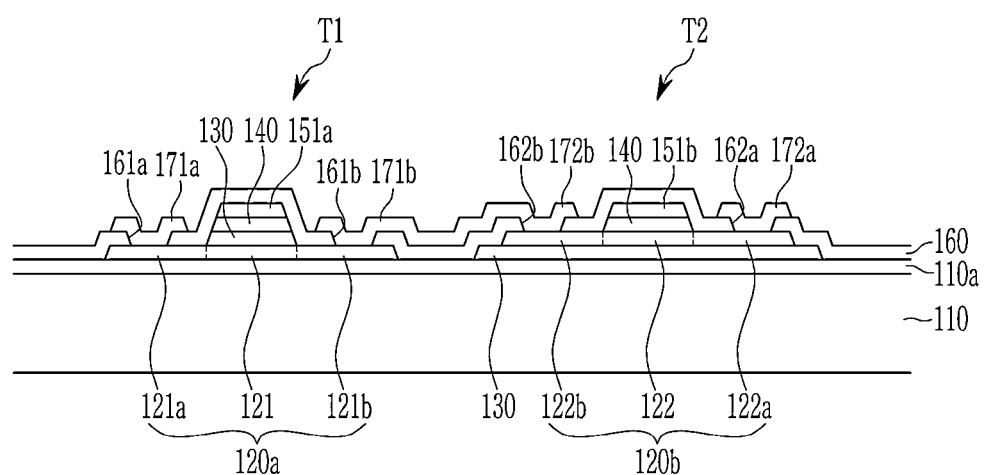
FIG. 14 is a cross-sectional view taken along a line XIV-XIV of FIG. 13.

Referring to FIG. 13 and FIG. 14, the electronic device 20 including the thin film transistors according to the exemplary embodiment includes the first transistor T1 including the low temperature polysilicon and the second transistor T2 including the amorphous oxide semiconductor. The first transistor T1 may be the P-type transistor, and the second transistor T2 may be the N-type transistor.

The interlayer structure of the first transistor T1 and the second transistor T2 is similar to the thin film transistor panel according to the exemplary embodiment shown in FIG. 2. A detailed description of the same configuration is omitted.

The first transistor T1 includes the first semiconductor layer 120a, the first insulation layer 130 disposed on the first semiconductor layer 120a, the second insulation layer 140 disposed on the first insulation layer 130, the first control electrode 151a disposed on the second insulation layer 140, the third insulation layer 160 disposed on the first control electrode 151a, and the first input electrode 171a and the first output electrode 171b disposed on the third insulation layer 160 and respectively connected to the first input region 121a and the first output region 121b of the first semiconductor layer 120a. The first semiconductor layer 120a includes the low temperature polycrystalline silicon (LTPS). The first semiconductor layer 120a includes the first channel region 121, and the first input region 121a and the first output region 121b disposed on both sides of the first channel region 121. The first input region 121a and the first output region 121b of the first semiconductor layer 120a are doped with the P-type impurity.

The second transistor T2 includes the first insulation layer 130 disposed on the substrate 110, the second semiconductor layer 120b disposed on the first insulation layer 130, the second insulation layer 140 disposed on the second semiconductor layer 120b, the second control electrode 151b disposed on the second insulation layer 140, the third insulation layer 160 disposed on the second control electrode 151b, and the second input electrode 172a and the second output electrode 172b disposed on the third insulation layer 160 and respectively connected to the second input region 122a and the second output region 122b of the second semiconductor layer 120b. The second semiconductor layer 120b includes the amorphous oxide semiconductor layer, and may include the amorphous IGZO (indium gallium zinc oxide). The second semiconductor layer 120b includes the second channel region 122, and the second input region 122a and the second output region 122b disposed on both sides of the second channel region 122. The second input region 122a and the second output region 122b second semiconductor layer 120b are doped with the N-type impurity.

The second insulation layer 140 of the first insulation layer 130 is disposed between the first semiconductor layer 120a and the first control electrode 151a of the first transistor T1 and may be a gate insulation layer of the first transistor T1.

The second insulation layer 140 is disposed between the second semiconductor layer 120b and the second control electrode 151b of the second transistor T2 and may be a gate insulation layer of the second transistor T2.

The first insulation layer 130 that is deposited at a high temperature and has the relatively high density and the second insulation layer 140 that is deposited at a low temperature and has the relatively low density are all disposed on first semiconductor layer 120a of the first transistor T1, but the second insulation layer 140 that is deposited at a low temperature and has the relatively low density is disposed and that deposited at a high temperature and has the relatively high density is not disposed on the second semiconductor layer 120b of the second transistor T2. In addition, the first semiconductor layer 120a including a low temperature polysilicon is in contact with the first insulation layer 130 that is deposited at a high temperature and has a relatively high density, and the second semiconductor layer 120b including an amorphous oxide semiconductor is in contact with the lower second insulation layer 140 that is deposited at a low temperature and has a relatively low density.

The channel ratio W2/L2 of the second transistor T2 may be about twice that of the channel ratio W1/L1 of the first transistor T1.

The first control electrode 151a and the second control electrode 151b of the first transistor T1 and the second transistor T2 are connected to the input terminal 1000, the high voltage input terminal 2000 is connected to the first input electrode 171a of the first transistor T1, the low voltage input terminal 3000 is connected to the second input electrode 172a of the second transistor T2, and the output terminal 4000 is connected to the first output electrode 171b of the first transistor T1 and the second output electrode 172b of the second transistor T2.

According to the electronic device 20 including thin film transistors of the exemplary embodiment, the first insulation layer 130 deposited at a high temperature is disposed on the first semiconductor layer 120a of the first transistor T1 including the low temperature polysilicon, and the second insulation layer 140 deposited at a low temperature is disposed on the second semiconductor layer 120b of the second transistor T2 including the amorphous oxide semiconductor, and accordingly the stability of the interface between the first semiconductor layer 120a of the first transistor T1 including a low temperature polysilicon and the first insulation layer 130 may be secured, and the damage caused by heat of the second semiconductor layer 120b of the second transistor T2 including the amorphous oxide semiconductor may be prevented.

In addition, the first control electrode 151a of the first transistor T1 and the first channel region 121 of the first semiconductor layer 120a are aligned vertically, and similarly, the second control electrode 151b of the second transistor T2 and the second channel region 122 of the second semiconductor layer 120b are aligned vertically, the parasitic capacitance according to the overlapping between the first control electrode 151a of the first transistor T1, and the first input region 121a and the first output region 121b, and the parasitic capacitance according to the overlapping between the second control electrode 151b of the second transistor T2, and the second input region 122a and the second output region 122b, may be reduced.

The characteristics of the manufacturing method of the thin film transistor panel described with reference to FIG. 3 to FIG. 11 may all be applicable to the manufacturing method of the electronic device including the thin film transistors described with reference to FIG. 12 to FIG. 14.

Accordingly, when forming the electronic device 20 including the thin film transistors according to the exemplary embodiment, the first semiconductor layer 120a including the low temperature polysilicon is formed, the first insulation layer 130 deposited at the high temperature is formed thereon, and the second semiconductor layer 120b including the amorphous oxide semiconductor is formed, it is possible to prevent the second semiconductor layer 120b from being damaged by the high temperature while forming the first insulation layer 130 deposited at a high temperature with good interface characteristics on the first semiconductor layer 120a. Also, the first impurity is doped to the second semiconductor layer 120b after forming the second control electrode 151b overlapping the second semiconductor layer 120b, the second impurity is doped to the first semiconductor layer 120a after forming the first control electrode 151a overlapping the first semiconductor layer 120a, and the second impurity doped to the first semiconductor layer 120a may be activated using the blue laser. In this way, while simultaneously forming the thin film transistor panel including the first transistor T1 including low temperature polysilicon and the second transistor T2 including the amorphous oxide semiconductor on one substrate by using the six exposure masks, the semiconductor of the first transistor T1 and the second transistor T2 may not be damaged.

Now, characteristics of the thin film transistor according to an exemplary embodiment are described through experimental examples.

Figure 15A:
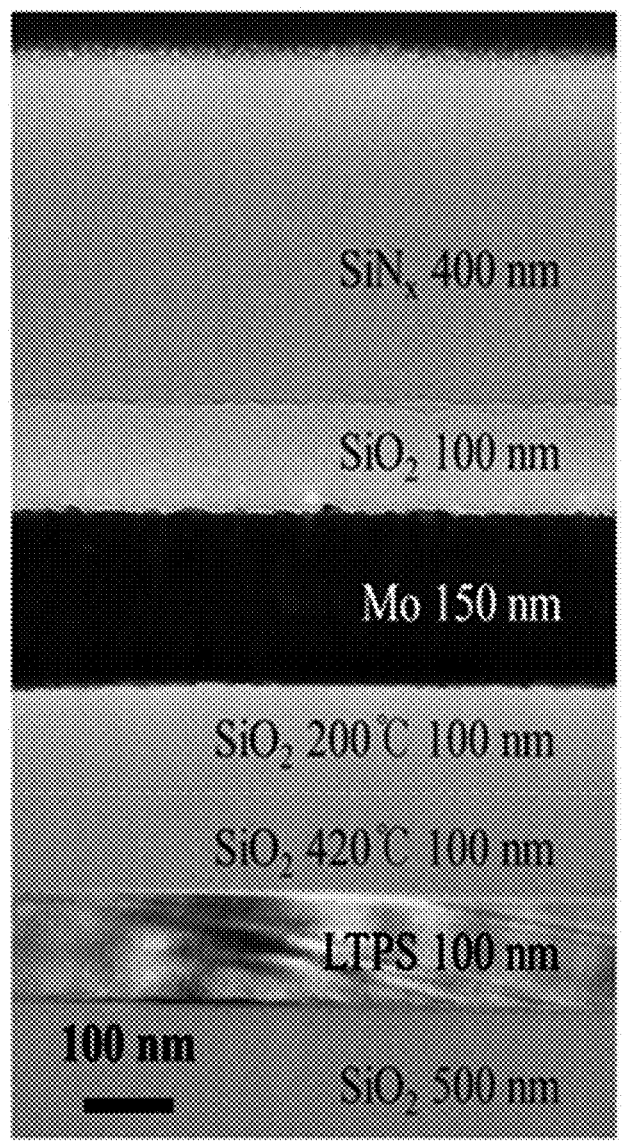
FIG. 15A and FIG. 15B are electron microscope photographs according to a first experimental example, respectively.
Figure 15B:
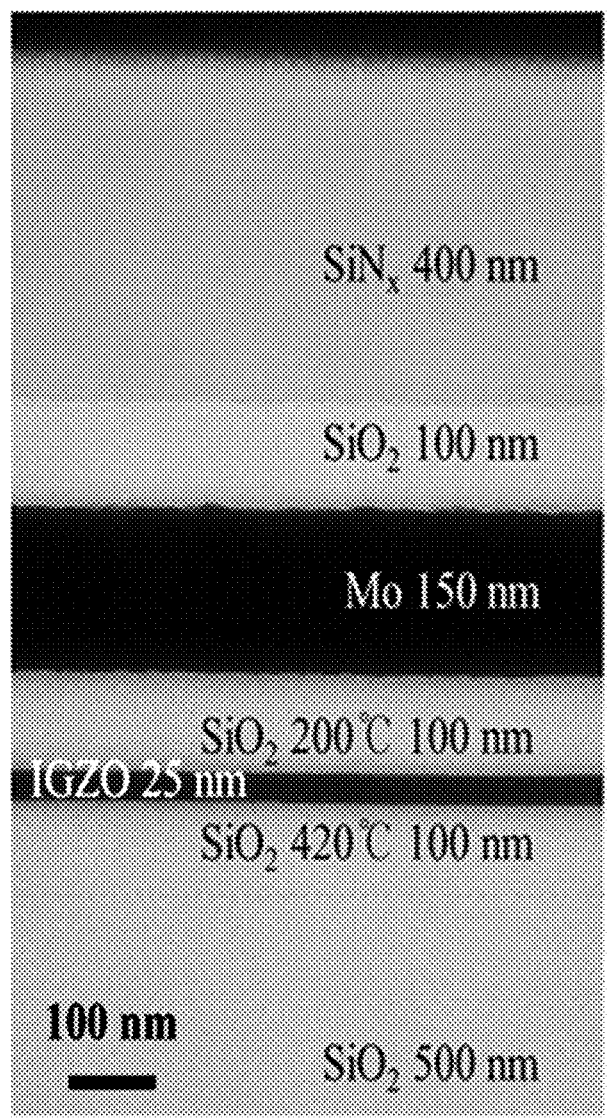

First, a first experimental example is described with reference to FIG. 15A to FIG. 19B. FIG. 15A and FIG. 15B are electron microscope photographs according to a first experimental example, and FIG. 16A to FIG. 19B are graphs showing electric characteristics of transistors according to a first experimental example.

In the first experimental example, the first transistor and the second transistor were formed according to the manufacturing method of the thin film transistor panel according to the exemplary embodiment described above.

Specifically, the barrier layer 110a consisting of the silicon oxide layer (SiO$_2$) having the thickness of about 400 nm was formed, the amorphous silicon (a-Si:H) layer is stacked on the barrier layer 110a by plasma-enhanced chemical vapor deposition (CVD) (PECVD), and the amorphous silicon layer was dehydrogenated at about 450° C. for about 1 hour, crystallized by blue laser annealing (BLA), and etched by the photolithography to form the first semiconductor layer 120a made of the low temperature polysilicon with the thickness of about 100 nm.

The first insulation layer 130 was formed by stacking the silicon oxide layer to the thickness of about 100 nm by a plasma-enhanced chemical vapor deposition (PECVD) method under a process temperature of 350° C. or higher on the first semiconductor layer 120a, and more specifically, a process temperature of about 420° C.

The amorphous IGZO was deposited with the thickness of about 25 nm by direct current (DC) sputtering on the first insulation layer 130 at about 200° C. and then etched by the photolithography to form the second semiconductor layer 120b.

The second insulation layer 140 was formed by depositing the silicon oxide layer (SiO$_2$) with the thickness of about 100 nm under the temperature of about 200° C. to overlap both the first semiconductor layer 120a and the second semiconductor layer 120b. A metal layer including the first control electrode 151a and the second control electrode 151b was formed by stacking molybdenum (Mo) with the thickness of about 150 nm through sputtering on the second insulation layer 140.

Next, like the method shown in FIG. 8A to FIG. 8C, the second control electrode 151b was formed, and N-type impurity fluorine (F) atoms was doped by plasma treatment of nitrogen trifluoride (NF$_3$) to the second semiconductor layer 120b to form the second input region 122a and the second output region 122b positioned on both sides of the second channel region 122 of the second semiconductor layer 120b. At this time, the second channel region 122 becomes a region that is vertically aligned with the second control electrode 151b.

Next, like the method shown in FIG. 10A to FIG. 10D, the first control electrode 151a was formed, the first semiconductor layer 120a was doped with boron (B) ions which is the P-type impurity by using an ion doping system, and the impurity was activated using a blue laser a room temperature to form the first input region 121a and the first output region 121b positioned on both sides of the first channel region 121 of the first semiconductor layer 120a. At this time, the first channel region 121 becomes a region that is vertically aligned with the first control electrode 151a.

Next, silicon oxide (SiO$_2$) was stacked with the thickness of about 100 nm through a plasma-enhanced chemical vapor deposition (PECVD) method at about 300° C. and silicon nitride (SiNx) was stacked with the thickness of about 400 nm to form the third insulation layer 160.

Also, the third insulation layer 160 was etched by the photolithography to form the contact hole, and molybdenum (Mo) was sputtered on the third insulation layer 160 and etched through the photolithography to form the input electrode and the output electrode. Finally, the annealing was performed for about 1 hour at a temperature of about 350° C. under a nitrogen (N$_2$) atmosphere.

Scanning electron microscope (SEM) photographs for the cross-section of the first transistor T1 and the second transistor T2 above-formed are shown in FIG. 15A and FIG. 15B, the characteristics of the first transistor T1 and the second transistor T2 were measured, and results thereof are shown in FIG. 16A to FIG. 19B.

FIG. 15A is the photograph for the cross-section of the first transistor T1, and FIG. 15B is the photograph for the cross-section of the second transistor T2. Referring to FIG. 15A and FIG. 15B, it may be confirmed that the interlayer structure between the first transistor T1 and the second transistor T2 was formed to be clearly distinguished, unlike the polycrystalline semiconductor formed by laser crystallization (ELA: Excimer Laser Annealing), and it may be confirmed that the surface of the low temperature polysilicon of the first transistor T1 was well formed without protrusion.

Figure 16A:
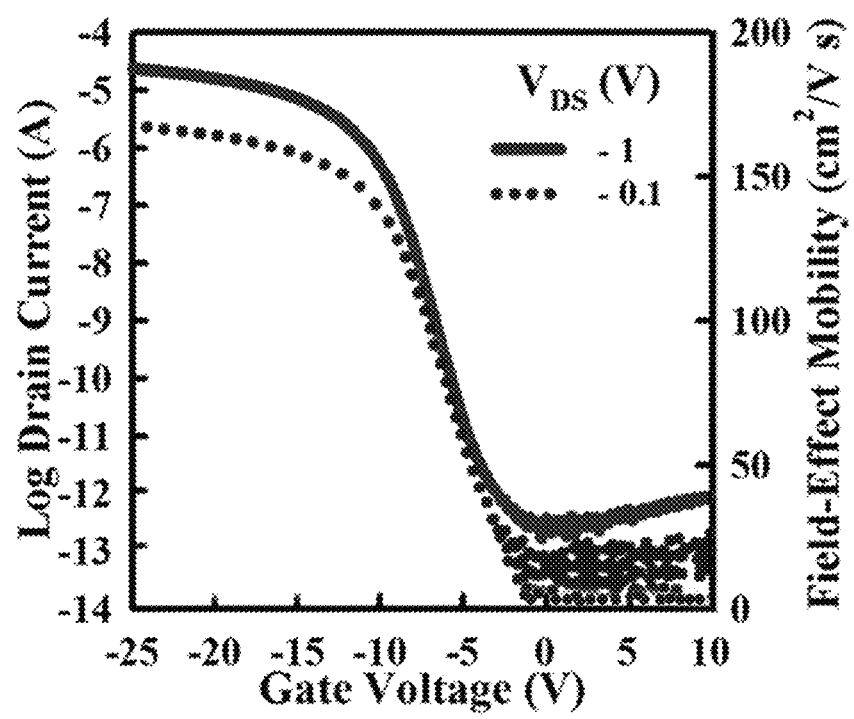
FIG. 16A, FIG. 16B, FIG. 17A, FIG. 17B, FIG. 18A, FIG. 18B, FIG. 19A, and FIG. 19B are graphs showing an electric characteristic of transistors according to a first experimental example.
Figure 16B:
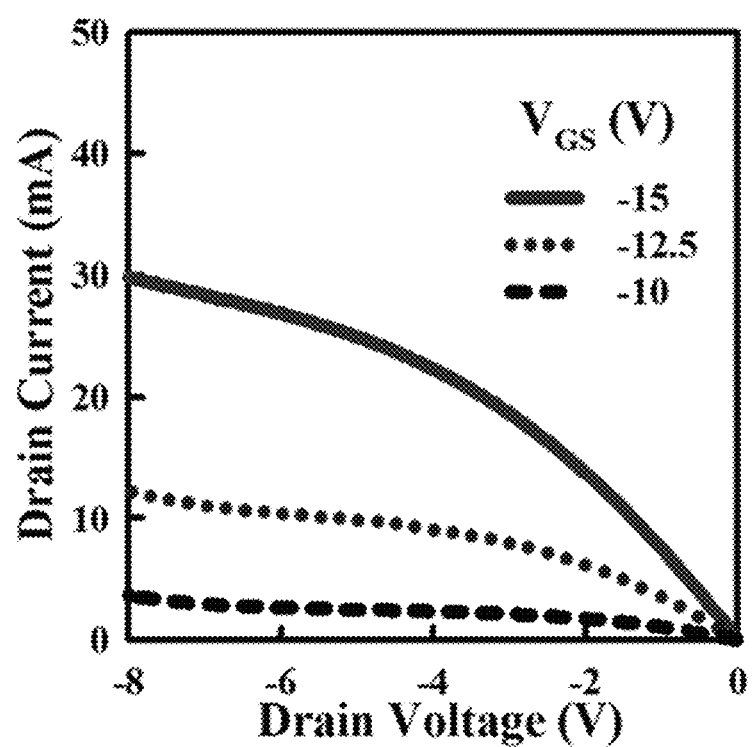
Figure 17A:
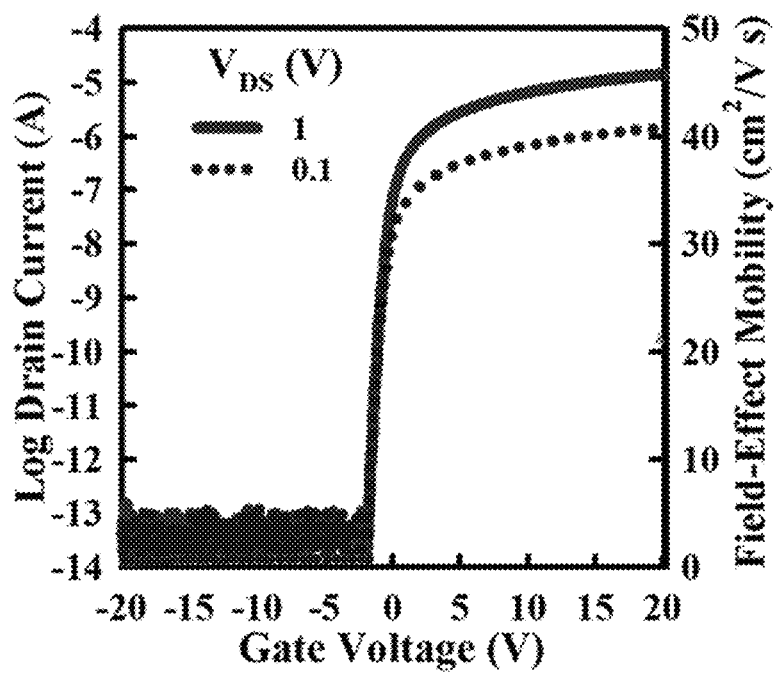
Figure 17B:
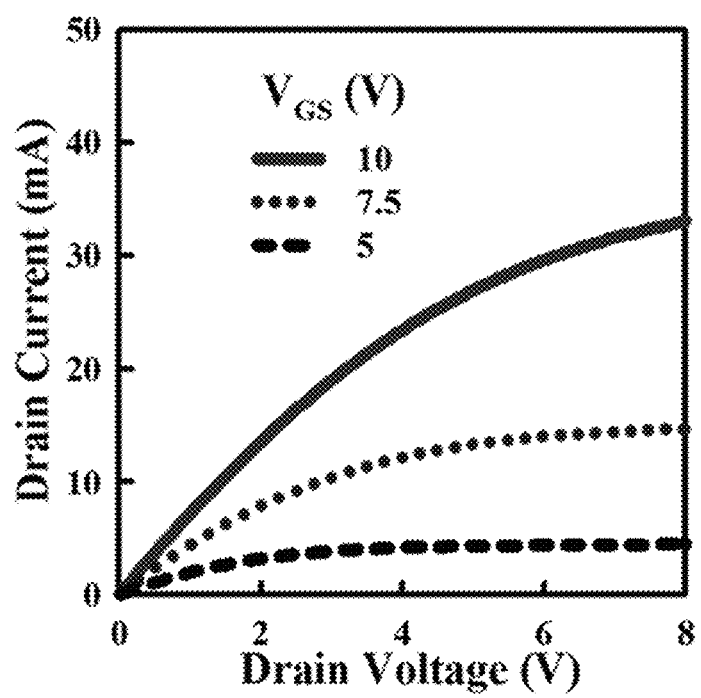
Figure 18A:
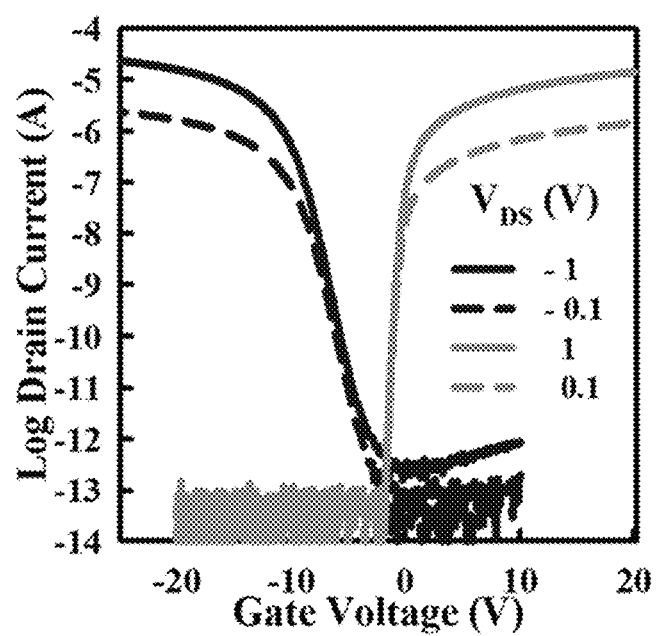

FIG. 16A and FIG. 16B are graphs showing the characteristic of the first transistor T1, FIG. 16A shows a transfer curved line of the first transistor T1, and FIG. 16B shows a pinch-off and saturation operation result of the first transistor T1. FIG. 17A and FIG. 17B are graphs showing the characteristic of the second transistor T2, FIG. 17A shows a transfer curved line of the second transistor T2, and FIG. 17B shows a pinch-off and saturation operation result of the second transistor T2. FIG. 18A simultaneously shows a current movement of the first transistor T1 and the second transistor T2, and FIG. 18B simultaneously shows pinch-off and saturation operation results of the first transistor T1 and the second transistor T2.

Referring to FIG. 16A to FIG. 17B, it may be confirmed that the channel region of the first transistor T1 has a threshold voltage ($V_{th}$) of −5.5V and field effect mobility (μFE) of 89.9 cm$^2$V$^{-1}$ s$^{-1}$, and the channel region of the second transistor T2 has the threshold voltage of 1.3 V and the field effect mobility of 22.5 cm$^2$V$^{-1}$ s$^{-1}$.

Figure 18B:
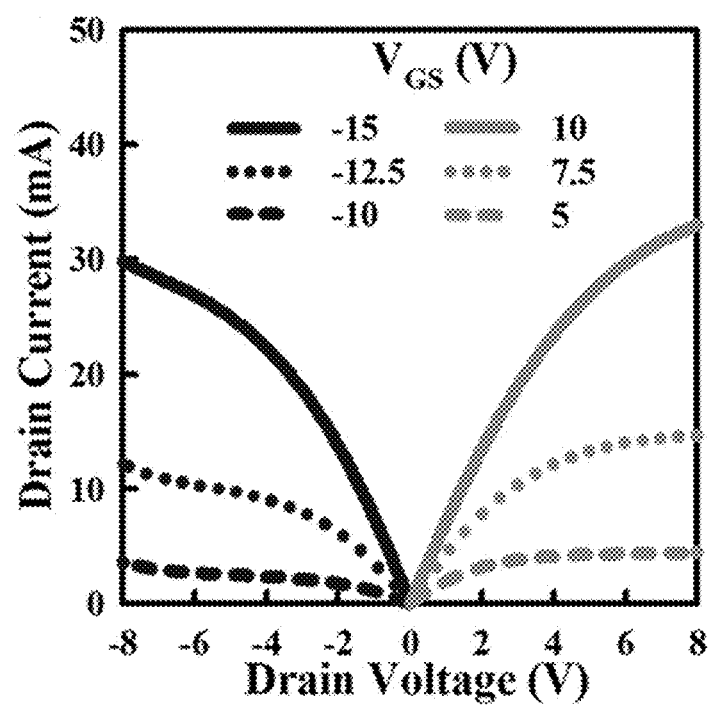

Referring to FIG. 18A and FIG. 18B, it may be confirmed that the current graph of the first transistor T1 and the second transistor T2 is stably symmetric. In this case, the channel ration (W/L) of the first transistor T1 was 10 µm/6 µm, and the channel ration (W/L) of the second transistor T2 was 20 µm/6 µm.

Figure 19A:
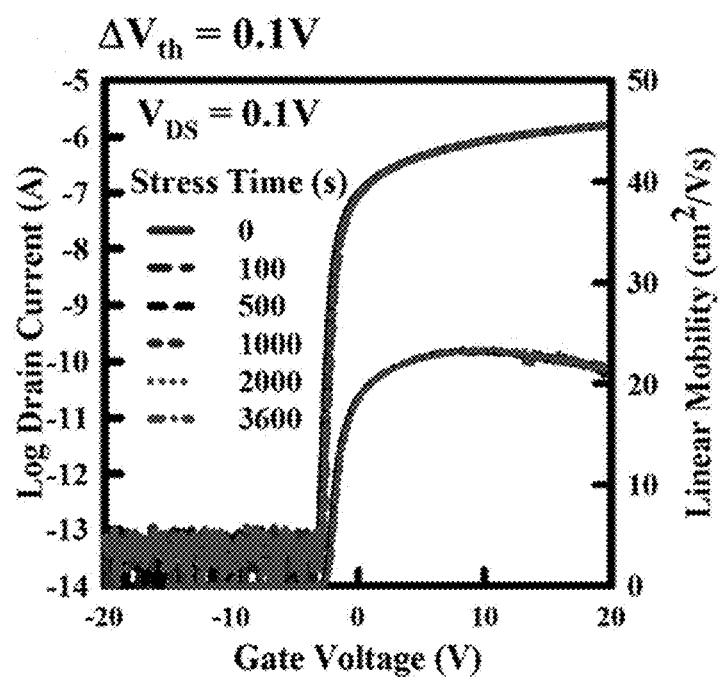
Figure 19B:
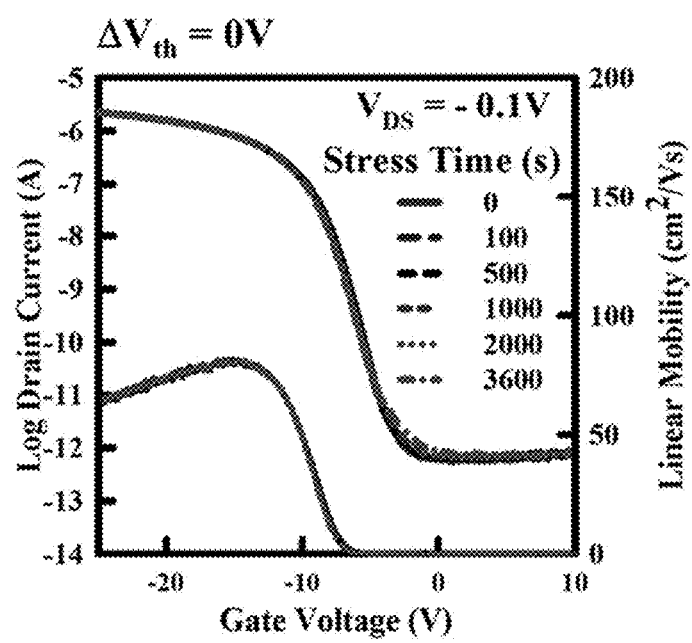

In addition, in the first experimental example, in order to check the electrical stability of the first transistor T1 and the second transistor T2, bias stability of the first transistor T1 and bias stability of the second transistor T2 are measured and results thereof are shown in FIG. 19A and FIG. 19B, respectively. Specifically, the results were measured by performing a bias temperature stress test at 60° C.

FIG. 19A represents a positive bias temperature stress (PBTS) result for the second transistor T2, and FIG. 19B represents a negative bias temperature stress (NBTS) result for the first transistor T1. Referring to FIG. 19A, when the positive bias temperature stress was performed at 60° C. for 1 hour for the second transistor T2, it was found that the change in the threshold voltage was only 0.1 V, and referring to FIG. 19B, when the negative bias temperature stress was performed at 60° C. for 1 hour for the first transistor T1, it was found that the change in the threshold voltage was 0 V. As such, it may be confirmed that both the first transistor T1 and the second transistor T2 have excellent bias stability. From this, it may be confirmed that excellent interface stability was formed between the first channel region 121 of the first transistor T1 and the first insulation layer 130 formed at a high temperature, and the excellent interface stability was formed between the second channel region 122 of the second transistor T2 and the second insulation layer 140 formed at a low temperature.

Figure 20:
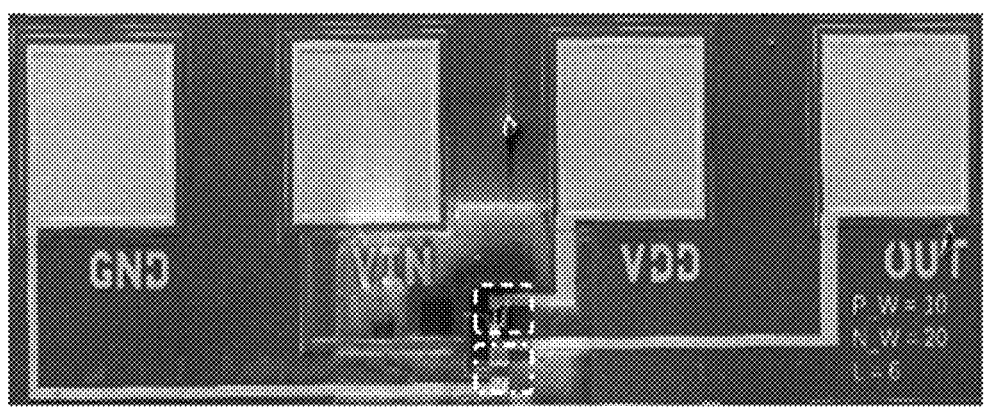
FIG. 20 is an electron microscope photograph of an electronic device formed in a second experimental example.

A second experimental example is described with reference to FIG. 20 to FIG. 22B. FIG. 20 is an electron microscope photograph of an electronic device formed in a second experimental example, FIG. 21 is an electron microscope photograph of transistors of an electronic device of FIG. 20, and FIG. 22A and FIG. 22B are graphs showing an electric characteristic of an electronic device according to a second experimental example.

In the second experimental example, as shown in FIG. 12 to FIG. 14, the CMOS inverter including the P-type first transistor T1 having the low temperature polysilicon and the N-type second transistor T2 having the amorphous oxide semiconductor is formed and the electric characteristic thereof was measured.

Figure 21:
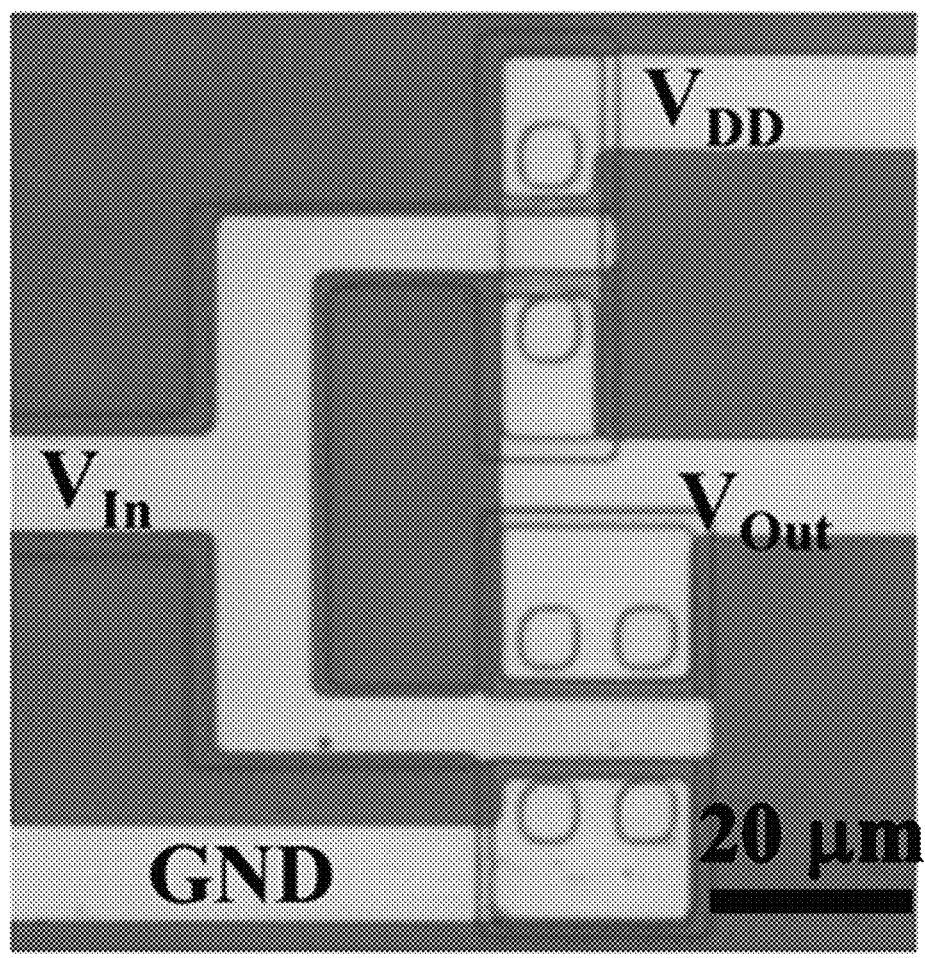
FIG. 21 is an electron microscope photograph of transistors of an electronic device of FIG. 20.

Referring to FIG. 20 and FIG. 21, the first control electrode 151a and the second control electrode 151b of the first transistor T1 and the second transistor T2 are connected to the input terminal ($V_{IN}$), the first input electrode 171a of the first transistor T1 is connected to a high voltage input terminal ($V_{DD}$), the second input electrode 172a of the second transistor T2 is connected to a low voltage input terminal (GND), and the first output electrode 171b of the first transistor T1 and the second output electrode 172b of the second transistor T2 are connected to an output terminal ($V_{out}$).

Figure 22A:
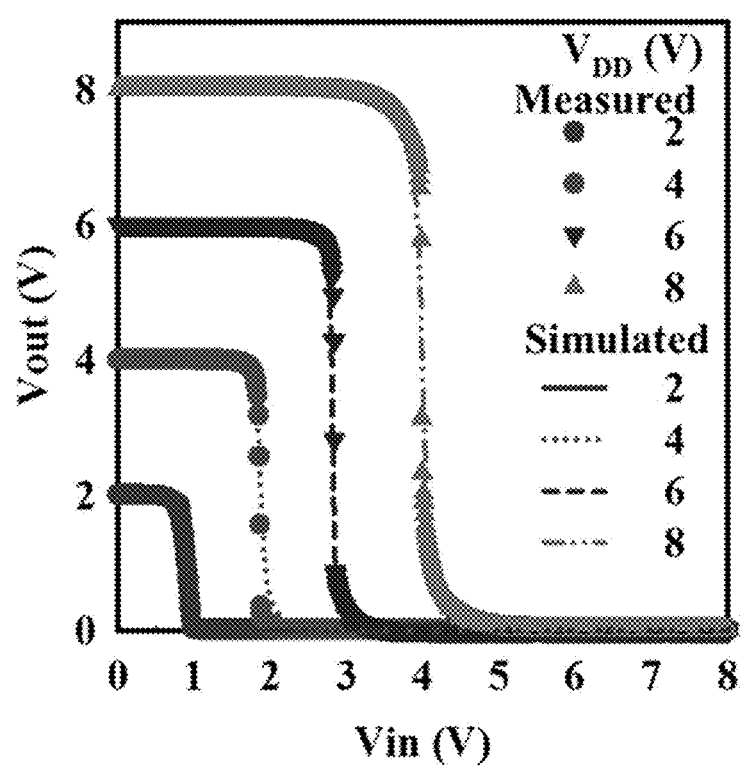
FIG. 22A and FIG. 22B are graphs showing an electric characteristic of an electronic device according to a second experimental example.
Figure 22B:
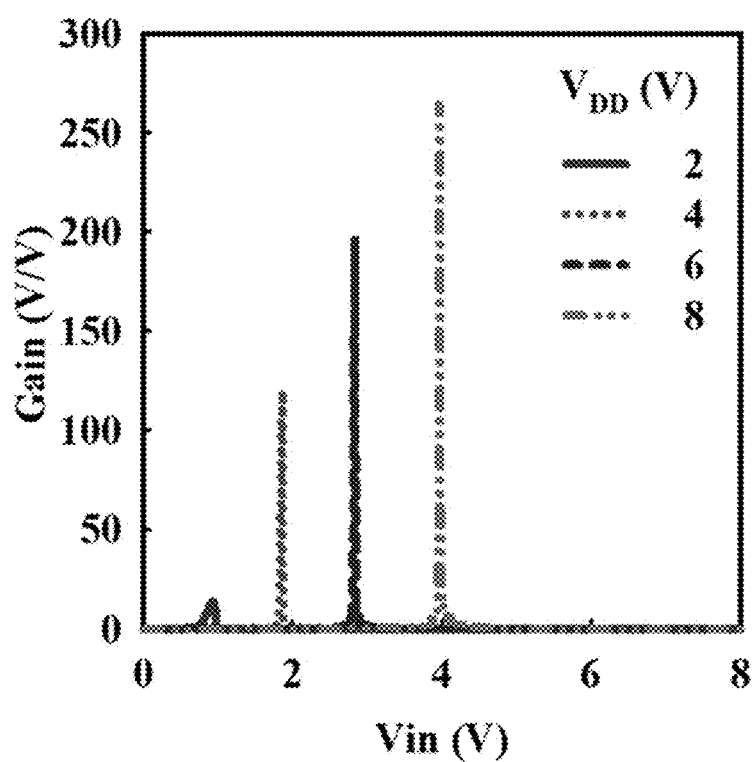

As above-described, the CMOS-type inverter is formed, the transfer curved line depending on the driving voltage input to the high voltage input terminal ($V_{DD}$) is represented in FIG. 22A, and a voltage gain of the inverter is shown in FIG. 22B.

Referring to FIG. 22A, it may be confirmed that a noise margin was 4.29 V at most and 3.69 V at least at a driving voltage ($V_{DD}$) of 8 V, referring to FIG. 22B, it can be seen that the gain increases constantly according to the driving voltage ($V_{DD}$), and for example, the gain was 264.5 V/V at the driving voltage ($V_{DD}$) of 8 V. As such, it may be confirmed that it has an excellent CMOS inverter characteristic.

Figure 23A:
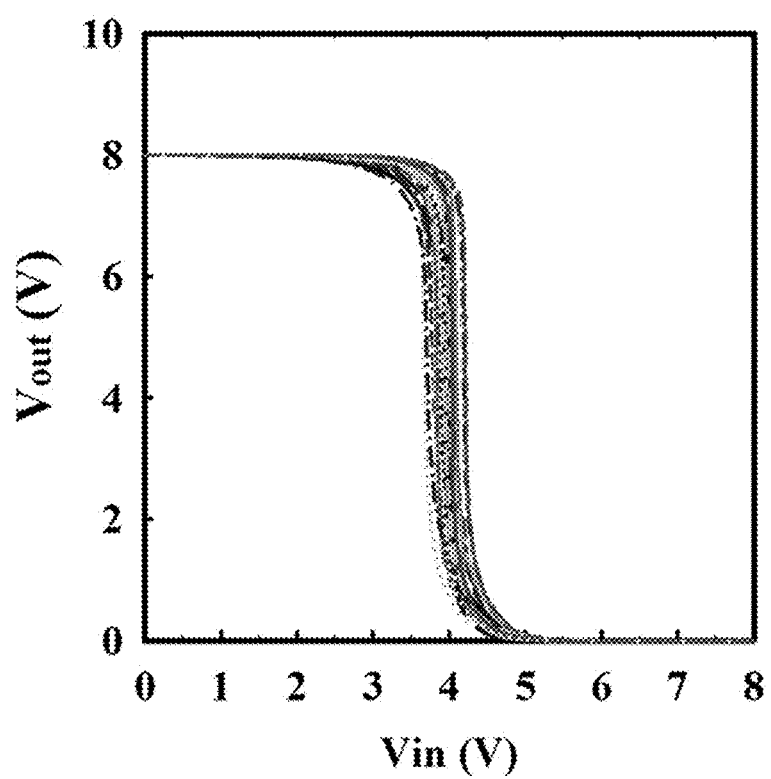
FIG. 23A and FIG. 23B are graphs showing an electric characteristic of an electronic device according to a third experimental example.
Figure 23B:
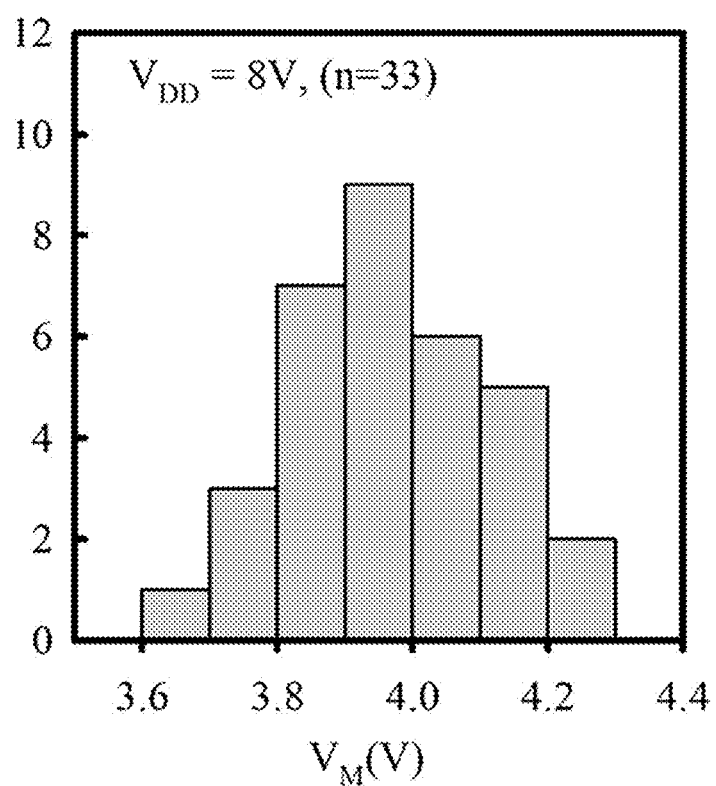

A result of a third experimental example is described with reference to FIG. 23A and FIG. 23B. FIG. 23A and FIG. 23B are graphs showing an electric characteristic of an electronic device according to a third experimental example.

In the third experimental example, like the second experimental example, the CMOS-type inverter including the P-type first transistor T1 and the N-type second transistor T2 was formed, a total of 33 inverters were formed, the driving voltage of 8 V was applied, then the electric characteristic was measured, and the result is shown in FIG. 21. FIG. 23A represents the transfer curved line, and FIG. 23B represents the voltage gain of the inverter voltage. Referring to FIG. 23A and FIG. 23B, it may be confirmed that the average value of the noise margin was 3.96 V, a standard deviation was 0.14 V, which had an excellent characteristic, and the voltage gain also showed an excellent result.

Next, a result of a fourth experimental example is described with reference to Table 1 as well as FIG. 24A to FIG. 25B. FIG. 24A, FIG. 24B, FIG. 25A, and FIG. 25B are graphs showing an electric characteristic of transistors according to a fourth experimental example.

Figure 24A:
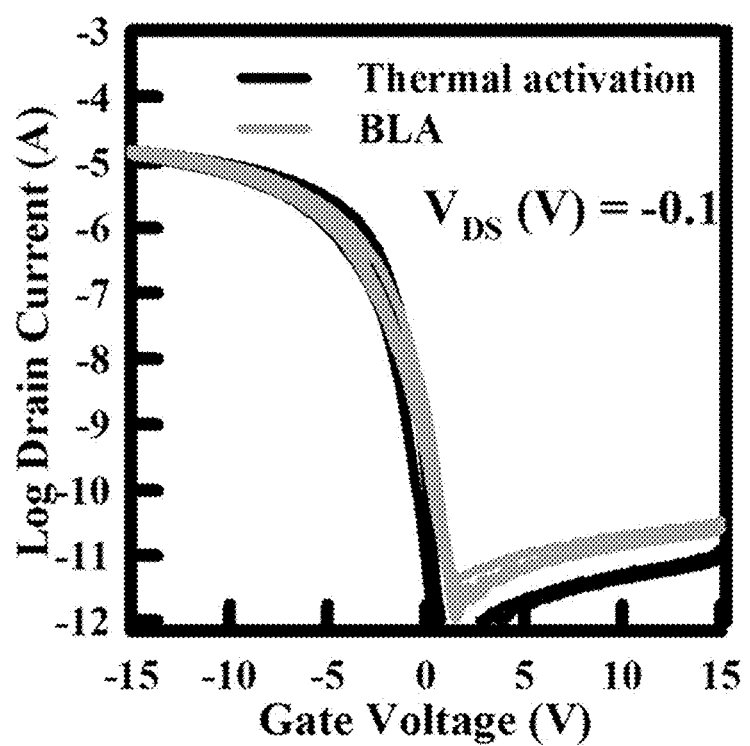
FIG. 24A, FIG. 24B, FIG. 25A, and FIG. 25B are graphs showing an electric characteristic of transistors according to a fourth experimental example.
Figure 24B:
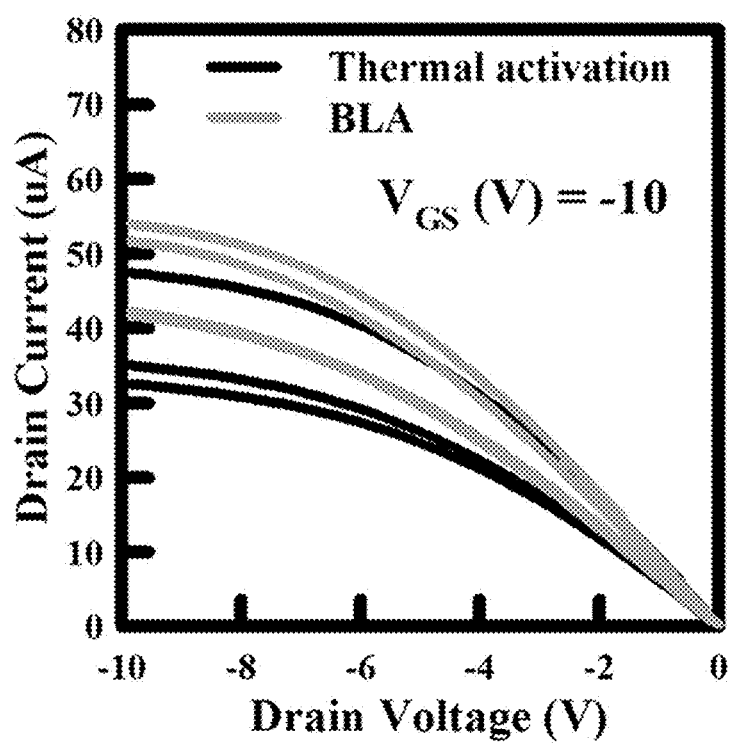

In the present experimental example, a semiconductor characteristic formed by a blue laser used in the manufacturing method of the transistor according to an exemplary embodiment was measured. In the fourth experimental example, for a case (case 1) that an impurity was implanted in a low temperature polysilicon and was activated by heat treatment at about 450° C. and a case (case 2) that was activated using a blue laser like the manufacturing method of the transistor according to an exemplary embodiment, sheet resistance of the low temperature polysilicon was measured and is shown in Table 1 and a transfer characteristic and an output characteristic of the case (case 1) and an output characteristic of the case (case 2) were measured and the results are shown in FIG. 24A and FIG. 24B in a graph.

TABLE 1

| Case | A first case (case 1) | A second case (case 2) |
|---|---|---|
| Sheet resistance ($\Omega/cm^2$) | 1.3 | 1 |

Referring to Table 1, it may be seen that the sheet resistance value of the low temperature polysilicon was smaller in the second case (case 2) that was activated using the blue laser like the manufacturing method of the transistor according to an exemplary embodiment than the first case (case 1) that was activated by heat treatment at about 450° C. Also, referring to FIG. 24A and FIG. 24B, compared to the first case that was activated by high temperature heat treatment, it may be confirmed that the transfer characteristic and the output characteristic were similar in the second case that was activated using the blue laser, and more specifically, the output characteristic is better in the second case when it was activated using the blue laser.

Figure 25A:
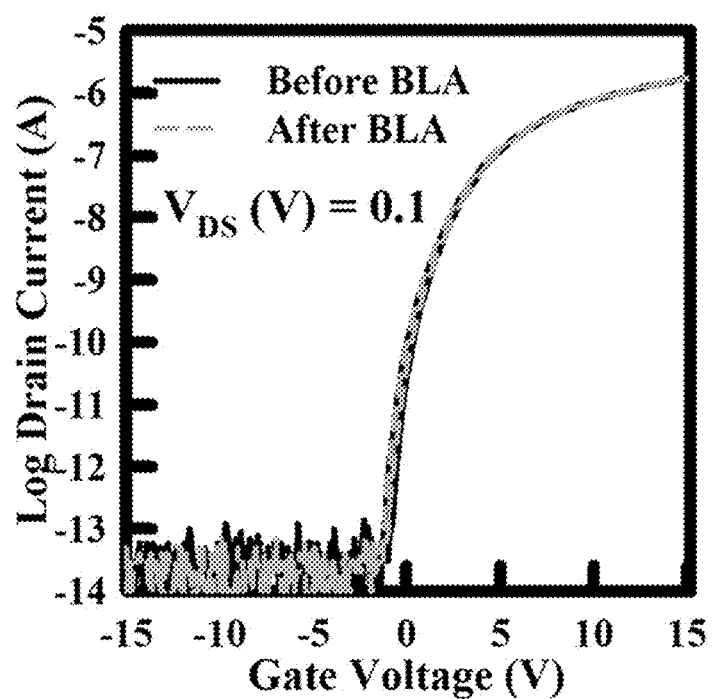
Figure 25B:
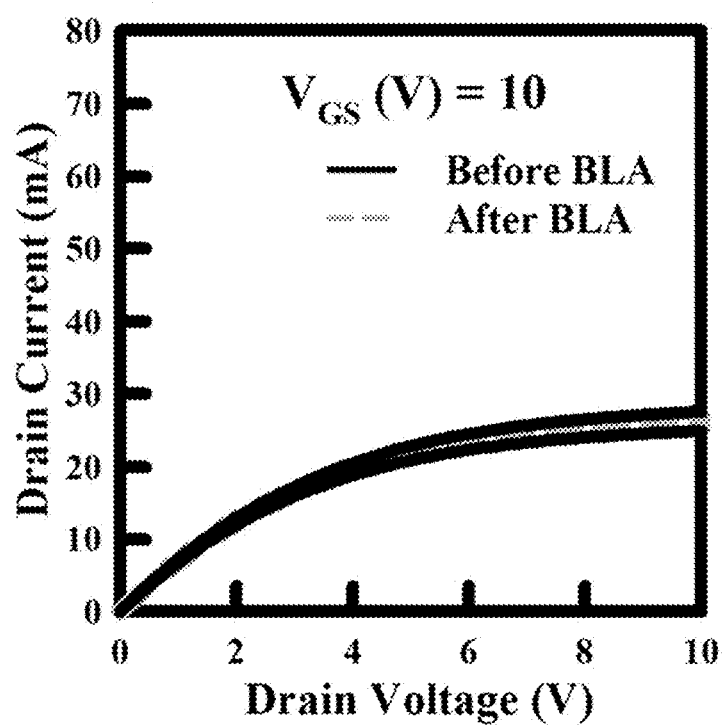

In the fourth experimental example, the transfer characteristic and the output characteristic of the second transistor T2 including the amorphous oxide semiconductor of a-IGZO were measured before and after the blue laser was irradiated and the results are shown in FIG. 25A and FIG. 25B in a graph.

Referring to FIG. 25A and FIG. 25B, it may be seen that it had the transfer characteristic and the output characteristic that were similar to that of before irradiating the blue laser even after irradiating the blue laser, and as a result, it may be confirmed that the second transistor T2 including a-IGZO of the amorphous oxide semiconductor was not damaged by the blue laser.

As above-described, according to the manufacturing method of the transistor according to the exemplary embodiment, it was found that the damage of the second transistor including a-IGZO of the amorphous oxide semiconductor may be prevented while maintaining excellent characteristics of the first transistor by using the blue laser to activate the first transistor including the low temperature polysilicon.

While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

10: thin film transistor panel
20: electronic device
110: substrate
120a, 120b: semiconductor layer
121, 122: channel region
121a, 122a: input region
121b, 122b: output region
130, 140, 160: insulation layer
151a, 151b: control electrode
152: conductor pattern
161a, 161b, 162a, 162b: contact hole
171a, 172a: input electrode
171b, 172b: output electrode
500a, 500b: photosensitive layer pattern
T1, T2: transistor

What is claimed is:

1. An electronic device comprising:
    a substrate;
    a first transistor disposed on the substrate and including a first semiconductor layer including a low temperature polysilicon, a first control electrode overlapping the first semiconductor layer, and a first gate insulation layer disposed between the first semiconductor layer and the first control electrode and including a first insulation layer and a second insulation layer;
    a second transistor disposed on the substrate and including a second semiconductor layer including an oxide semiconductor, a second control electrode overlapping the second semiconductor layer, and a second gate insulation layer disposed between the second semiconductor layer and the second control electrode of the second transistor and including the second insulation layer;
    an input terminal connected to the first control electrode and the second control electrode;
    a high voltage input terminal connected to a first input electrode of the first transistor;
    a low voltage input terminal connected to a second input electrode of the second transistor; and
    an output terminal connected to a first output electrode of the first transistor and a second output electrode of the second transistor,
    wherein the density of the first insulation layer is higher than the density of the second insulation layer, and
    the first semiconductor layer of the first transistor is in contact with the first insulation layer, and the second semiconductor layer of the second transistor is in contact with the second insulation layer.

2. The electronic device of claim 1, wherein
    the first semiconductor layer of the first transistor includes a region doped with a P-type impurity, and
    the second semiconductor layer of the second transistor includes a region doped with an N-type impurity.

3. The thin film transistor panel of claim 1, wherein
    the channel ratio (W/L) of the second transistor is two or more times the channel ratio (W/L) of the first transistor.

4. The electronic device of claim 1, wherein
    the second semiconductor layer includes IGZO.

5. The electronic device of claim 4, wherein
    the first semiconductor layer includes a first channel region, and a first input region and a first output region disposed on both sides of the first channel region,
    the second semiconductor layer includes a second channel region, and a second input region and a second output region disposed on both sides of the second channel region,
    the first input region and the first output region are doped with a first impurity, and
    the second input region and the second output region are doped with a second impurity of a different type from the first impurity.

6. The electronic device of claim 5, wherein
    the first impurity is a P-type impurity, and the second impurity is an N-type impurity.

7. The electronic device of claim 5, wherein
    the first channel region of the first semiconductor layer is aligned vertically with the first control electrode, and
    the second channel region of the second semiconductor layer is aligned vertically with the second control electrode.

8. A manufacturing method of a thin film transistor panel comprising:
    forming a first semiconductor layer including a low temperature polysilicon on a substrate;
    forming a first insulation layer on the first semiconductor layer;
    forming a second semiconductor layer including an oxide semiconductor on the first insulation layer;
    forming a second insulation layer on the first insulation layer and the second semiconductor layer;
    forming a conductor pattern overlapping the first semiconductor layer and a second control electrode overlapping the second semiconductor layer, and forming a second channel region, and a second input region and a second output region disposed on both sides of the second channel region in the second semiconductor layer; and
    forming a first control electrode overlapping the first semiconductor layer and forming a first channel region, and a first input region and a first output region disposed on both sides of the first channel region in the first semiconductor layer,
    wherein the deposition temperature of the first insulation layer is higher than the deposition temperature of the second insulation layer, and
    wherein
    the forming of the conductor pattern, the second control electrode, the second input region, and the second output region includes:
    depositing a metal layer on the second insulation layer;

forming a first photosensitive layer pattern covering all the first semiconductor layer and disposed at a position overlapping the second control electrode of the second semiconductor layer;

etching the metal layer, the second insulation layer, and the first insulation layer by using the first photosensitive layer pattern as a mask to form the conductor pattern overlapping the first semiconductor layer and the second control electrode overlapping the second semiconductor layer; and doping a first impurity by using the first photosensitive layer pattern, the conductor pattern, and the second control electrode as a mask to form the second input region and the second output region.

9. The manufacturing method of claim 8, wherein
the first insulation layer is formed in a process temperature of 350° C. or more, and
the second insulation layer is formed in a process temperature of 250° C. or less.

10. The manufacturing method of claim 8, wherein
the second semiconductor layer is formed of an oxide semiconductor including IGZO.

11. The manufacturing method of claim 8, wherein
the forming of the first control electrode, the first input region, and the first output region includes:

forming a second photosensitive layer pattern covering all the second semiconductor layer and disposed at a position overlapping the first control electrode of the first semiconductor layer;

etching the conductor pattern, the second insulation layer, and the first insulation layer by using the second photosensitive layer pattern as a mask to form the first control electrode overlapping the first semiconductor layer; and doping a second impurity by using the second photosensitive layer pattern and the first control electrode as a mask to form the first input region and the first output region.

12. The manufacturing method of claim 11, further comprising:
activating the second impurity doped in the first input region and the first output region.

13. The manufacturing method of claim 12, wherein
laser is irradiated in the activation.

14. The manufacturing method of claim 11, wherein
the first impurity is a P-type impurity, and the second impurity is an N-type impurity.

* * * * *